United States Patent
Sumita

(12) United States Patent
(75) Inventor: Masaya Sumita, Hyogo (JP)
(73) Assignee: Matsushita Electric Industrial Co., Ltd., Osaka (JP)
( * ) Notice: Subject to any disclaimer, the term of this patent is extended or adjusted under 35 U.S.C. 154(b) by 76 days.
(21) Appl. No.: 11/106,471
(22) Filed: Apr. 15, 2005
(65) Prior Publication Data
US 2005/0184811 A1 Aug. 25, 2005

Related U.S. Application Data

(62) Division of application No. 10/449,089, filed on Jun. 2, 2003.

(30) Foreign Application Priority Data

Jun. 3, 2002 (JP) .............................. 2002-161979

(51) Int. Cl.
H03L 7/00 (2006.01)
(52) U.S. Cl. .............................. 331/16; 331/25; 331/74
(58) Field of Classification Search ................... 331/16
See application file for complete search history.

(56) References Cited

U.S. PATENT DOCUMENTS 3,610,954 A 10/1971 Treadway

(10) Patent No.: US 7,274,261 B2
(45) Date of Patent: Sep. 25, 2007

| | | |
|---|---|---|
| 4,378,509 A | 3/1983 | Hatchett et al. |
| 4,829,258 A | 5/1989 | Volk et al. |
| 4,922,141 A | 5/1990 | Lofgren et al. |
| 5,412,349 A | 5/1995 | Young et al. |
| 5,757,238 A | 5/1998 | Ferraiolo et al. |
| 6,154,096 A | 11/2000 | Chien |
| 6,166,990 A | 12/2000 | Ooishi et al. |
| 6,407,601 B1 | 6/2002 | Lin |
| 6,433,645 B1 * | 8/2002 | Mann et al. ................... 331/18 |

FOREIGN PATENT DOCUMENTS

| JP | 63-119318 A | 5/1988 |
|---|---|---|
| JP | 01-099433 | 4/1989 |
| JP | 7-262781 A | 10/1995 |
| JP | 2000-224035 A | 8/2000 |

OTHER PUBLICATIONS

Japanese Office Action with English Translation issued in corresponding Japanese Patent Application No. JP 2003-151943, mailed Jun. 26, 2007.

\* cited by examiner

Primary Examiner—Joseph Chang
(74) Attorney, Agent, or Firm—McDermott Will & Emery LLP

(57) ABSTRACT

During a period of preparation for actual operation, a reference clock is supplied to both a comparison clock input portion and a feedback clock input portion of a phase comparator while a feedback loop of a PLL (phase-locked loop) is interrupted, and a delay of a reset signal within the phase comparator is adjusted so as to reduce a detection dead zone of phase differences in the phase comparator.

4 Claims, 27 Drawing Sheets

SEMICONDUCTOR INTEGRATED CIRCUIT

RELATED APPLICATION

This application is a divisional of application Ser. No. 10/449,089 filed Jun. 2, 2003.

BACKGROUND OF THE INVENTION

The present invention relates to semiconductor integrated circuits including a clock generation circuit, and more particularly to semiconductor integrated circuits in which a PLL (phase-locked loop) circuit is provided.

Computing systems, such as microprocessors or microcontrollers, are provided with PLL circuits functioning as a clock multiplier circuit in order to realize the function of multiplying an external frequency at a portion of the central processing unit to perform high-speed operations. Furthermore, in recent microprocessors, it is desirable to be able to maintain the clock phase between an external bus and within the semiconductor integrated circuit with high precision.

In conventional methods, the time that it takes until the PLL circuit stabilizes after the power has been turned on is counted with a timer, the clock supply from the PLL circuit to the central processing unit is halted for a certain amount of time, and the multiplied clock supply is started as soon as the timer overflows.

Now, in the phase comparator of the PLL circuit it is desirable that there is a linear relation between the phase difference of the two signals entered into it and the voltage that is output. However in practice, there are cases in which it is not possible to detect tiny phase differences, so that there may be a dead zone of phase differences, and there may be discontinuities when the sensitivity is too high.

It is known that the length of the delay time in the reset circuit has a large influence on the input/output characteristics of the phase comparator. In other words, in order to improve the input/output characteristics of the phase comparator, it is necessary to adjust the delay time in the reset circuit to an appropriate value. However, in the phase comparator according to a first piece of conventional technology, the delay time becomes shorter than the appropriate value because the reset circuit is made of one 4-input NAND circuit, and the input/output characteristics exhibit a dead zone (U.S. Pat. No. 3,610,954).

Several improvements have been suggested in order to adjust the delay time of the reset circuit to an appropriate value. In a second piece of conventional technology, the output of the reset signal is delayed by making the channel width of a transistor constituting the 4-input NAND circuit narrower (JP S63-119318A). Furthermore, in a third piece of conventional technology, a plurality of capacitors are used as a means for delaying the output of the reset signal (U.S. Pat. No. 4,378,509).

As described above, in the phase comparator according to the first conventional technology, the reset circuit is constituted by one 4-input NAND circuit, so that the delay time becomes shorter than the appropriate value and there is a dead zone in the input/output characteristics. In the case of the second conventional technology, a worsening of the yield due to variations in the channel width or the like has become unavoidable with the sub-micron gate widths of recent transistors. And with the third conventional technology, the capacitors lead to an increase of the chip surface area.

Charge pump circuits also have an aspect that worsens their input/output characteristics. When using a current-type charge pump circuit, it occurs that the output voltage of the phase comparator changes even though there is no phase difference between the two input signals. This means that even though clocks of the same phase are input, the phase difference is detected erroneously and a highly accurate PLL circuit cannot be realized.

Furthermore, clock drivers are designed such that they can supply a clock synchronized with zero skew to the function blocks, but due to temperature dependencies, process variations and the like, there are skew variations among chips.

Also, inside the function blocks, circuits that use two phases of clocks with clock synchronization, such as dynamic circuits or memories, are designed such that they can operate stably with some delay so as to avoid signal racing, but due to process variations, the margin between the two phases of the clocks may disappear, resulting in faulty operation.

Furthermore, there are function blocks that include the function of interrupting a series of operations when processing has become unnecessary during that series of operations, in order to reduce energy consumption, but depending on the operation frequency and process variations, the operation may not be halted completely, resulting in faulty operation.

Moreover, providing a tuning circuit in order to solve these problems is a waste of time, because the start of the operation of the tuning circuit needs to wait until the PLL circuit has stabilized.

SUMMARY OF THE INVENTION

It is an object of the present invention to make it possible to efficiently utilize the time before a clock generation circuit supplies a system clock signal, and in particular the time until the oscillation of a PLL circuit has stabilized.

In order to achieve this object, a semiconductor integrated circuit in accordance with the present invention includes a clock generation circuit that generates a system clock signal from a reference clock signal, and a specific circuit portion within the semiconductor integrated circuit is adjusted using the reference clock signal before the clock generation circuit supplies the system clock signal. In particular in a semiconductor integrated circuit provided with a PLL circuit, the specific circuit portion is adjusted using the reference clock signal before the PLL circuit has reached stable oscillation.

More specifically, the reference clock signal is supplied to both a comparison clock input portion and a feedback clock input portion of the phase comparator while a feedback loop of the PLL circuit is interrupted, and the delay of a reset signal within the phase comparator is adjusted so as to reduce a detection dead zone of phase differences in the phase comparator.

In the case of a bandgap reference circuit for supplying a reference voltage to a current charge pump circuit within the PLL circuit, the reference clock signal is supplied to either a comparison clock input portion or a feedback clock input portion of a phase comparator within the PLL circuit while a feedback loop of the PLL circuit is interrupted, and a phase correction amount of that bandgap reference circuit is adjusted such that the bandgap reference circuit does not oscillate.

In the case of a current charge pump circuit within the PLL circuit, the reference clock signal is supplied to either a comparison clock input portion or a feedback clock input portion of a phase comparator within the PLL circuit while a feedback loop of the PLL circuit is interrupted, and the current driving ability of the current charge pump circuit is adjusted.

In the case of a clock distribution circuit for distributing the system clock signal to a plurality of function blocks, skew between a plurality of clock drivers within the clock distribution circuit is adjusted such that output clock skew of the clock distribution circuit is eliminated.

In the case of a data holding portion operating in synchronization with the system clock signal, such as a memory circuit including a word line and a sense amplifier, or a dynamic circuit of at least two stages connected in series, a racing adjustment is performed in the internal operation of that data holding circuit.

In the case of a functional circuit having a power consumption reduction function such as a cache circuit, when it has been detected from the reference clock signal and a feedback clock signal of the PLL circuit that a phase fine-tuning period has been entered after frequency capturing of the PLL circuit has been terminated, an adjustment is made by stopping the operation of one of the circuit portions within the functional circuit in correspondence with the oscillation clock signal of the PLL circuit.

DETAILED DESCRIPTION OF THE INVENTION

Referring to the accompanying drawings, the following is a detailed description of embodiments of a semiconductor integrated circuit in accordance with the present invention.

EMBODIMENT 1

Figure 1:
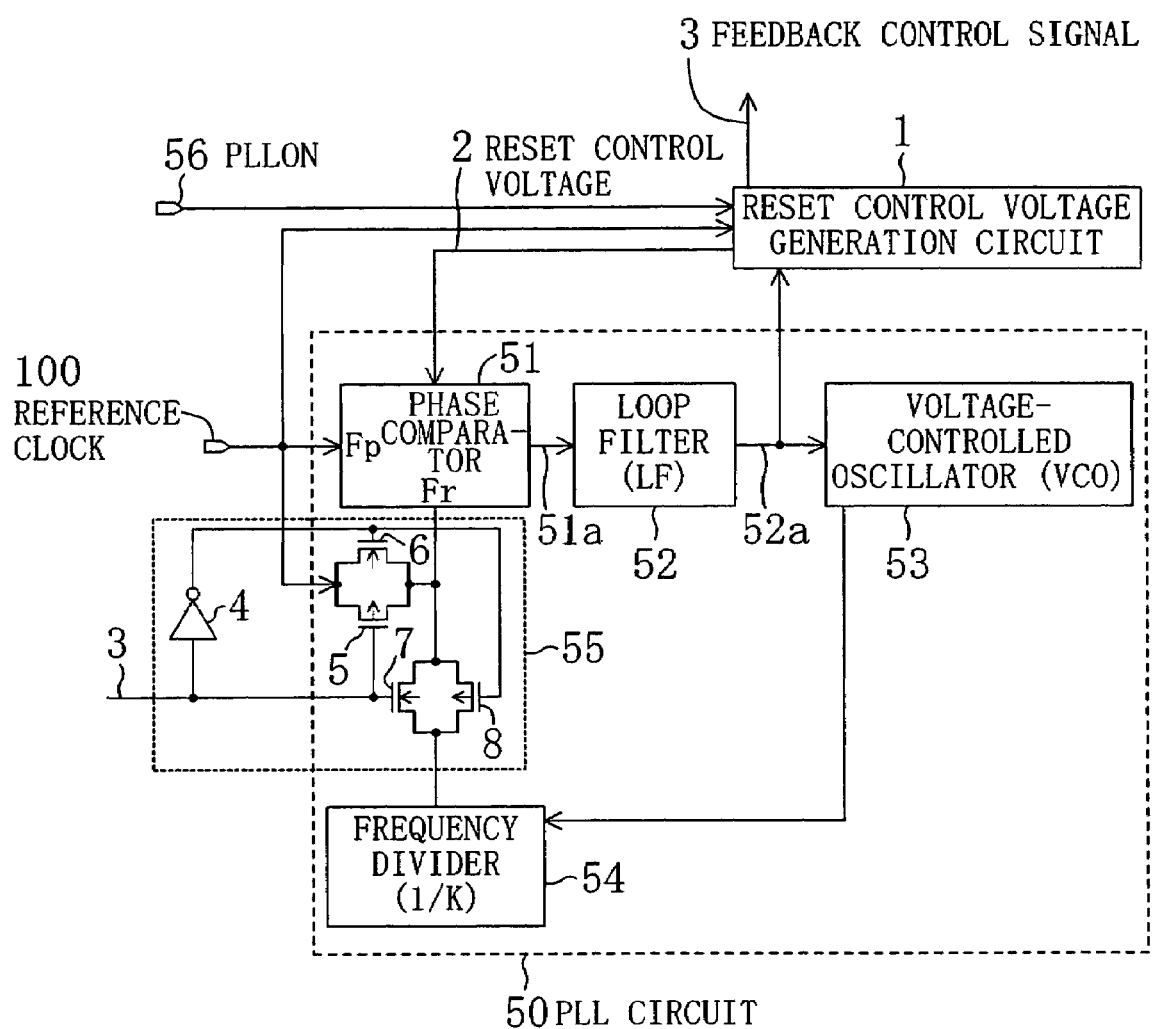
FIG. 1 is a block diagram of a semiconductor integrated circuit in accordance with a first embodiment of the present invention.

FIG. 1 is an example of a semiconductor integrated circuit according to the present invention, and is a block diagram illustrating a configuration example of a semiconductor integrated circuit incorporating a PLL circuit. In FIG. 1, numeral 50 denotes a PLL circuit including a phase comparator 51, a loop filter 52, a voltage-controlled oscillator 53, and a programmable frequency divider 54. The phase comparator 51 has input ports Fp and Fr, and compares the phases of the signals that are input into those two ports. A reference clock 100 is input into Fp. The output 51a of the phase comparator 51 is connected to the loop filter 52, the output 52a of the loop filter 52 is connected to the voltage-controlled oscillator 53, and the voltage-controlled oscillator 53 converts this input voltage into a frequency. The clock signal output from the voltage-controlled oscillator 53 is connected to the programmable frequency divider 54. The switch circuit 55 is controlled by a feedback control signal 3. When this feedback control signal 3 is "H," then Fr of the phase comparator 51 is connected to the programmable frequency divider 54, and when the feedback control signal 3 is "L," then Fr of the phase comparator 51 is connected to the reference clock signal Fp. In this example of the switch circuit 55, numerals 6 and 7 denote N-type MOS (metal oxide silicon) transistors, and numerals 5 and 8 denote P-type MOS (metal oxide silicon) transistors. The MOS transistors 5 and 6 together constitute a transfer gate, as do the MOS transistors 7 and 8. Numeral 4 denotes an inverter. The output 52a of the loop filter 52 is given into a reset control voltage generation circuit 1. This reset control voltage generation circuit 1 takes a PLL ON signal 56, which enables the operation of the PLL circuit 50, as a reset signal, performs a synchronization operation using the reference clock 100, and detects ripples in the loop filter output 52a. When there are ripples, it generates a voltage that is lower than the initial voltage, and outputs this voltage as a reset control voltage, which is input into the phase comparator 51. Moreover, if no ripples are detected, a voltage that is higher than the initial voltage is generated as the reset control voltage 2.

Figure 2:
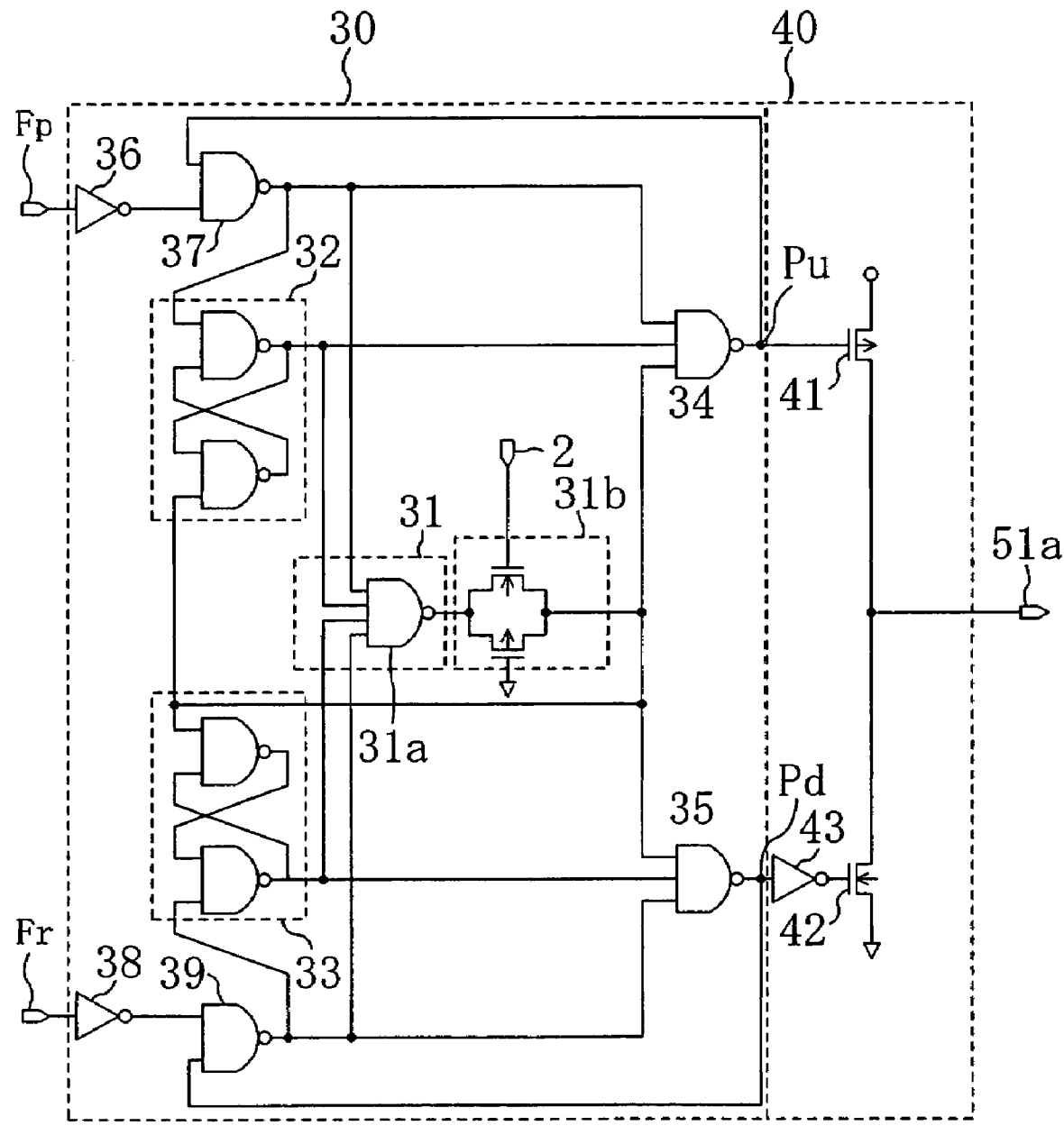
FIG. 2 is a circuit diagram showing the configuration of the phase comparator in FIG. 1.

FIG. 2 is an example of the phase comparator 51 of the PLL circuit 50, in which numeral 30 denotes a digital phase comparator, and numeral 40 denotes a charge pump circuit. The digital phase comparator 30 is made of a reset circuit 31, a first flip-flop 32, a second flip-flop 33, a first 3-input NAND circuit 34, a second 3-input NAND circuit 35, a first inverter 36, a first 2-input NAND circuit 37, a second inverter 38, and a second 2-input NAND circuit 39. The reference clock signal Fp is input via the first inverter 36 to the first NAND circuit 37, whereas the comparison clock signal Fr is input into via the second inverter 38 into the second NAND circuit 39. The output signal of the first NAND circuit 37 is input into the first flip-flop 32 and the first 3-input NAND circuit 34, whereas the output signal of the second NAND circuit 39 is input into the second flip-flop 33 and the second 3-input NAND circuit 35. The output signal of the first flip-flop 32 is input into the first 3-input NAND circuit 34, whereas the output signal of the second flip-flop 33 is input into the second 3-input NAND circuit 35. The reset circuit 31 is made of a 4-input NAND circuit 31, into which are input the output signals of the first flip-flop 32 and the second flip-flop 33 as well as the output signals of the first NAND circuit 37 and the second NAND circuit 39. The output signal of the reset circuit 31 is connected to the source of a transfer gate 31b, whose drain is input as a reset signal to the first flip-flop 32 and the second flip-flop 33, but is also input into the first 3-input NAND circuit 34 and the second 3-input NAND circuit 35. The gate of the N-type MOS transistor of the transfer gate 31b is connected to the reset control voltage 2 in FIG. 1. The gate of the P-type MOS transistor of the transfer gate 31b is connected to ground. When the potential of the reset control voltage 2 becomes high, the output of the transfer gate 31b changes faster, and when the potential of the reset control voltage 2 becomes low, the output of the transfer gate 31b changes slower.

The first 3-input NAND circuit 34 outputs a first phase-difference detection signal Pu, which is ordinarily "H," but which becomes "L" while the phase of the reference clock signal Fp is ahead of the comparison clock signal Fr. The second 3-input NAND circuit 35 outputs a second phase-difference detection signal Pd, which is ordinarily "H," but which becomes "L" while the phase of the reference clock signal lags behind the comparison clock signal Fr. The charge pump circuit 40 is made of a P-type MOS transistor 41, an N-type MOS transistor 42 and an inverter 43. The source of the P-type MOS transistor 41 is connected to a current source, and its drain is connected to the drain of the N-type MOS transistor 42. The source of the N-type MOS transistor 42 is connected to ground. The first phase-difference detection signal Pu output from the first 3-input NAND circuit 34 is input into the gate of the P-type MOS transistor 41, whereas the second phase-difference detection signal Pd output from the second 3-input NAND circuit 35 is input into the gate of the N-type MOS transistor 42, after being inverted by the inverter 43. The drain of the P-type MOS transistor 41 (and the drain of the N-type MOS transistor 42) is connected to the output terminal 51a.

When the first phase-difference detection signal Pu is "L," the P-type MOS transistor 41 becomes conducting, so that the drain potential of the P-type MOS transistor 41 (potential of the output 51a) increases. And when the second phase-difference detection signal Pd is "L," then the output signal of the inverter 43 becomes "H" and the N-type MOS transistor 42 becomes conducting, so that the drain potential of the P-type MOS transistor 42 (potential of the output 51a) decreases. This means that the potential of the output 51a increases when the phase of the reference clock signal Fp is ahead of the comparison clock signal Fr, and decreases when it lags.

Figure 3:
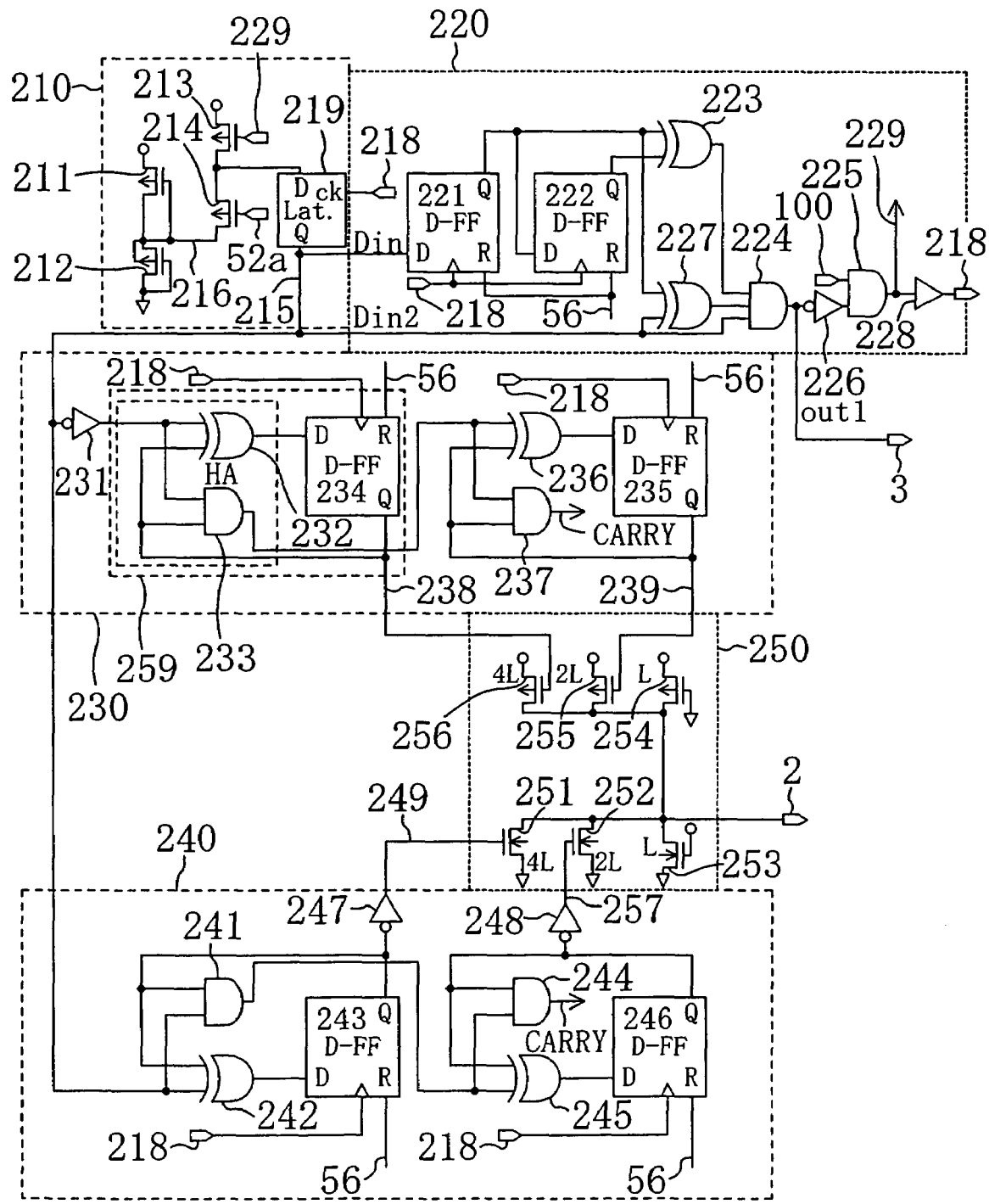
FIG. 3 is a circuit diagram showing the configuration of the reset control voltage circuit in FIG. 1.

FIG. 3 shows an example of the reset control voltage generation circuit 1. The reset control voltage generation circuit 1 includes a ripple detection circuit 210, an incremental counter 230, an incremental counter 240, a ripple elimination termination circuit 220, and a reset control voltage output circuit 250. The ripple detection circuit 210 detects ripples in the ripple filter output 52a. The incremental counter 230 is incremented when the ripple detection circuit 210 detects ripples. The incremental counter 240 is incremented when the ripple detection circuit 210 does not detect ripples. The ripple elimination termination circuit 220 sets the feedback control signal 3 to "H" and turns off the clocks of the ripple detection circuit 210 and the incremental counters 230 and 240 when, within three periods of the reference clock 100, ripples are detected only at the first and the third period but not at the second period. When the incremental counter 230 is incremented, the reset control voltage output circuit 250 decreases the reset control voltage 2, and when the incremental counter 240 is incremented, the reset control voltage output circuit 250 increases the reset control voltage 2.

The ripple detection circuit 210 is made of P-type MOS transistors 211, 212 and 213, an N-type MOS transistor 214, and a latch circuit 219 that holds data during the period that the clock 218 is "L." The ripple detection circuit 210 acts as a dynamic circuit, with a clock signal 229 generated by the ripple elimination termination circuit 220. The potential of the voltage 216 is generated by the P-type MOS transistors 211 and 212, at a desired voltage value. When the loop filter 52 generates a voltage that is by the threshold of the N-type MOS transistor 214 higher than the potential of the voltage 216, then the output signal 215 of the ripple detection circuit 210 is changed from "H" to "L." When no ripples are detected, the output signal 215 stays "H."

The incremental counters 230 and 240 include half adders (HA) made of EXOR circuits (exclusive or circuits: output is "H" only when input is inconsistent) 232, 236, 242, 245, and AND circuits 233, 237, 241, 244, as well as flip-flops 234, 235, 243, and 246 with reset. Numeral 259 in FIG. 3 denotes a 1-bit incremental register made of the low-order HA 232, 232 and flip-flop 234 with reset, which receives the output 215 of the ripple detection circuit 210 via the inverter 231. The clock 218 generated by the ripple elimination termination circuit 220 is input into the clocks of the flip-flops 234, 235, 243 and 246, and the PLLON signal 56 is input into the resets of those flip-flops.

The ripple elimination termination circuit 220 is made of flip-flops 221 and 222 with reset, EXOR circuits 223 and 227, a 3-input AND circuit 224, an inverter 226, an AND circuit 225, and a buffer 228. The data input into the flip-flop 221 is the output signal 215 of the ripple detection circuit 210, and the data input into the flip-flop 222 is the Q output of the flip-flop 221. The outputs of the flip-flops 221 and 222 are input into the EXOR circuit 223, and the output of the flip-flop 221 as well as the output signal 215 of the ripple detection circuit 210 are input into the EXOR circuit 227. The output of the EXOR circuits 223 and 227 and the output signal 215 of the ripple detection circuit 210 are input into the 3-input AND circuit 224, and the output of the 3-input AND circuit 224 is input into the inverter 226 and connected to the feedback control signal 3. The output of the inverter 226 and the reference clock 100 are input into the AND circuit 225, and the output of the AND circuit 225 is used as the clock 229, and connected to the buffer 228. The output of the buffer 228 is used as the clock 218. The clock 218 is used as the clock of the flip-flops 221 and 222, and the PLLON signal 56 is used as the reset of those flip-flops.

The reset control voltage output circuit 250 is made of a parallel arrangement of P-type MOS transistors 256, 255 and 254, and a parallel arrangement of N-type MOS transistors 251, 252 and 253. The gate lengths of the P-type MOS transistors 256, 255 and 254 and the N-type MOS transistors 251, 252 and 253 are set to a ratio of 4:2:1. The gate of 256 is connected to the output 238 of the flip-flop 234, and the gate of 255 is connected to the output 239 of the flip-flop 235. The gate of 251 is connected to the output of the flip-flop 243, which has been inverted into the output signal 249 with an inverter 247. The gate of 252 is connected to the output of the flip-flop 246, which has been inverted into the output signal 257 with an inverter 248.

Figure 4:
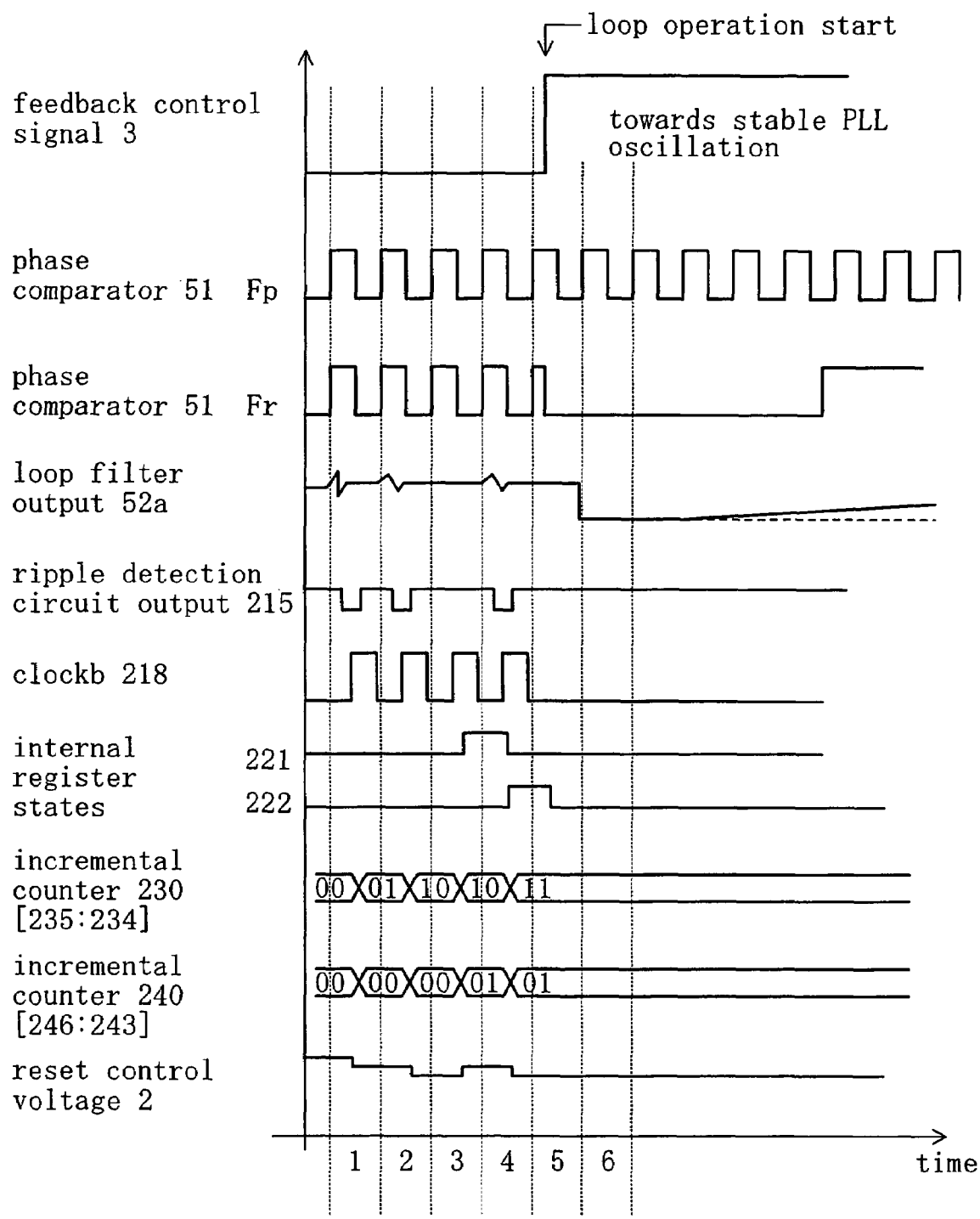
FIG. 4 is a timing chart illustrating the operation of the semiconductor integrated circuit in FIG. 1.

FIG. 4 is a timing chart of the signals in FIG. 1, FIG. 2 and FIG. 3. In FIG. 4, the horizontal axis denotes time, and the vertical axis denotes the feedback control signal 3, the two input ports Fp and Fr of the phase comparator 51, the output 52a of the loop filter 52, the ripple detection circuit output 215, the clock (clockb) 218, the 2-bit register internal states 221, 222, and, expressed in binary notation, the internal states of the flip-flops 234 and 235 constituting the incremental counter 230 as well as the internal state of the flip-flops 243 and 246 constituting the incremental counter 240, and the reset control voltage 2.

Referring to FIG. 4, the following is an explanation of the operation of FIG. 1, FIG. 2 and FIG. 3, constituting Embodiment 1. In the PLL circuit 50, before the power is turned on, the PLLON signal 56 is "L," and the value in the flip-flops 221, 222, 234, 235, 243 and 246 inside the reset control voltage generation circuit 1 is "L." After the power is turned on, the PLLON signal 56 becomes "H," and first, when the feedback control signal 3 is "L," the feedback loop is interrupted, so that the reference clock 100 is input into Fr of the phase comparator 51 with the same period and the same phase as into Fp. Ideally, if clocks of the same phase are input into the phase comparator 51, no ripples should occur in the loop filter output 52a. However, in the case of this example, let us assume that due to process variations, the reset delay time of the phase comparator 51 has become shorter than the desired time. Ripples occur in the loop filter output 52a in the first period of the reference clock 100. Thus, the output signal 215 of the ripple detection circuit 210 becomes "L," so that "H" is input into the low-order HA of the incremental counter 230, and the internal state of the flip-flops 234, 235 becomes "01". Thus, the gate of the P-type MOS transistor 256 of the reset control voltage output circuit 250 becomes "H," and the P-type MOS transistor 256 is cut off. Since the P-type MOS transistors 256, 255 and 254 are connected in parallel, their ON resistance becomes higher, and the potential of the reset control voltage decreases. This is transmitted to the gate electrode of the transfer gate 31b in FIG. 2, increasing its delay. As a result, in the second period of the reference clock 100, the delay of the reset output of the digital phase comparator 30 is increased. In the second period, there are still ripples in the output of the loop filter 52, and the reset control voltage output circuit 250 further decreases the potential of the reset control voltage 2. Thus, the delay of the reset output of the phase comparator 30 becomes even larger. In the third period, there are no more ripples in the output of the loop filter 52. At the time when there are no more ripples, "H" is input into the incremental register 240 of the reset control voltage generation circuit 1. Then, the reset control voltage generation circuit 1 increases the potential of the reset control voltage 2. In the fourth period, the delay of the reset output of the digital phase comparator 30 becomes smaller than in the third period, and ripples start to appear again. The delay of the reset output of the digital phase comparator 30 becomes larger, and in the fifth period, there are no more ripples in the output of the loop filter 52. At the time when there are no more ripples, the output of the AND circuit 224 of the ripple elimination termination circuit 220 of the reset control voltage generation circuit 1, that is, the feedback control signal 3 becomes "H." The internal clock 229 is stopped, and the potential of the reset control voltage 2 is held. Then, in the sixth period, the PLL circuit 50 is connected by the switch circuit 55 to the feedback loop, and ordinary stable PLL oscillation is reached. Thus, it is possible to realize a phase comparison that is very precise with respect to temperature fluctuation and initial device variations of the digital phase comparator 30.

It should be noted that in FIG. 2, due to variations in the switching voltage of the 3-input NAND circuits 34 and 35, there is the possibility that Pu and Pd are output at the same time, but it is also possible to ease this by inserting a buffer between the transfer gate 31b and the 3-input NAND circuits 34 and 35 to make the output waveform steep. Furthermore, it is preferable that the delay time between the 3-input NAND circuit 34 and the P-type MOS transistor 41 and the delay time between the 3-input NAND circuit 35 and the N-type MOS transistor 42 are made the same by adjusting the transistor sizes or adding a buffer. It is further possible to control not only the gate voltage of the N-type transistor but also the gate voltage of the P-type transistor in the transfer gate 31b in FIG. 2.

The phase comparator 30 shown in FIG. 2 is only an example, and as long as it is a phase comparator that is configured by a sequential logic with a reset function, the reset delay can be varied with a similar approach with any type.

EMBODIMENT 2

Figure 5:
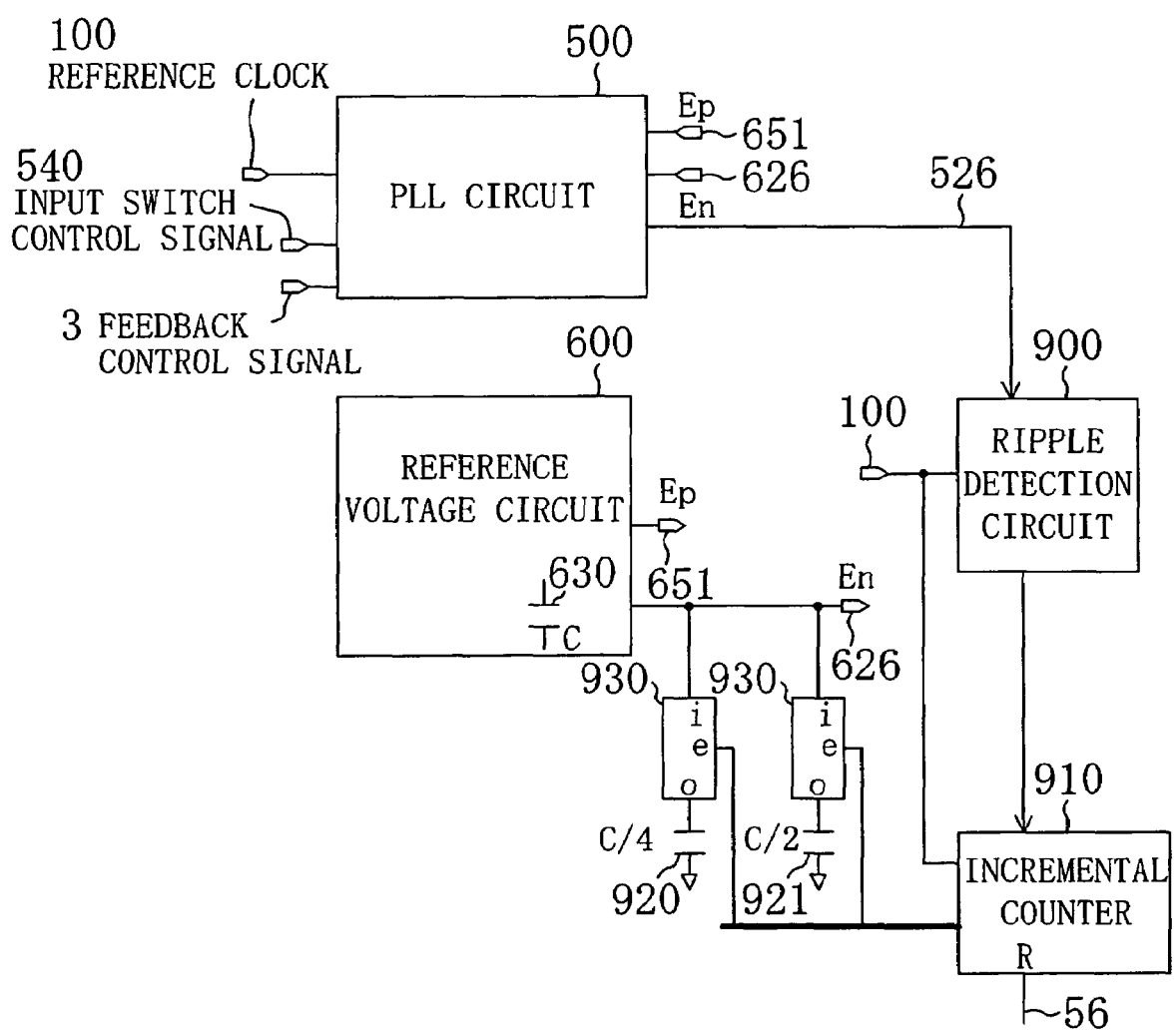
FIG. 5 is a block diagram of a semiconductor integrated circuit in accordance with a second embodiment of the present invention.

FIG. 5 is another example of a semiconductor integrated circuit according to the present invention. The semiconductor integrated circuit in FIG. 5 has a PLL circuit 500 and a reference voltage circuit 600. The output of the charge pump circuit of the PLL circuit 500 is connected to a ripple detection circuit 900, and the output of the ripple detection circuit 900 is connected to a 2-bit incremental counter 910 that is incremented when ripples are detected. An output bus of this incremental counter 910 is connected to a control signal of switch circuits 930 that respectively connect En 626 to capacitors 920 and 921 when the control input e is "H." and disconnect En 626 when the control input e is "L." The capacitors 920 and 921 are respectively set to ¼ and ½ of the capacitance of a capacitor 630 inside the reference voltage circuit 600. The ripple detection circuit 900 is the circuit 210 explained for Embodiment 1, and also the incremental counter 910 is similar.

Figure 6:
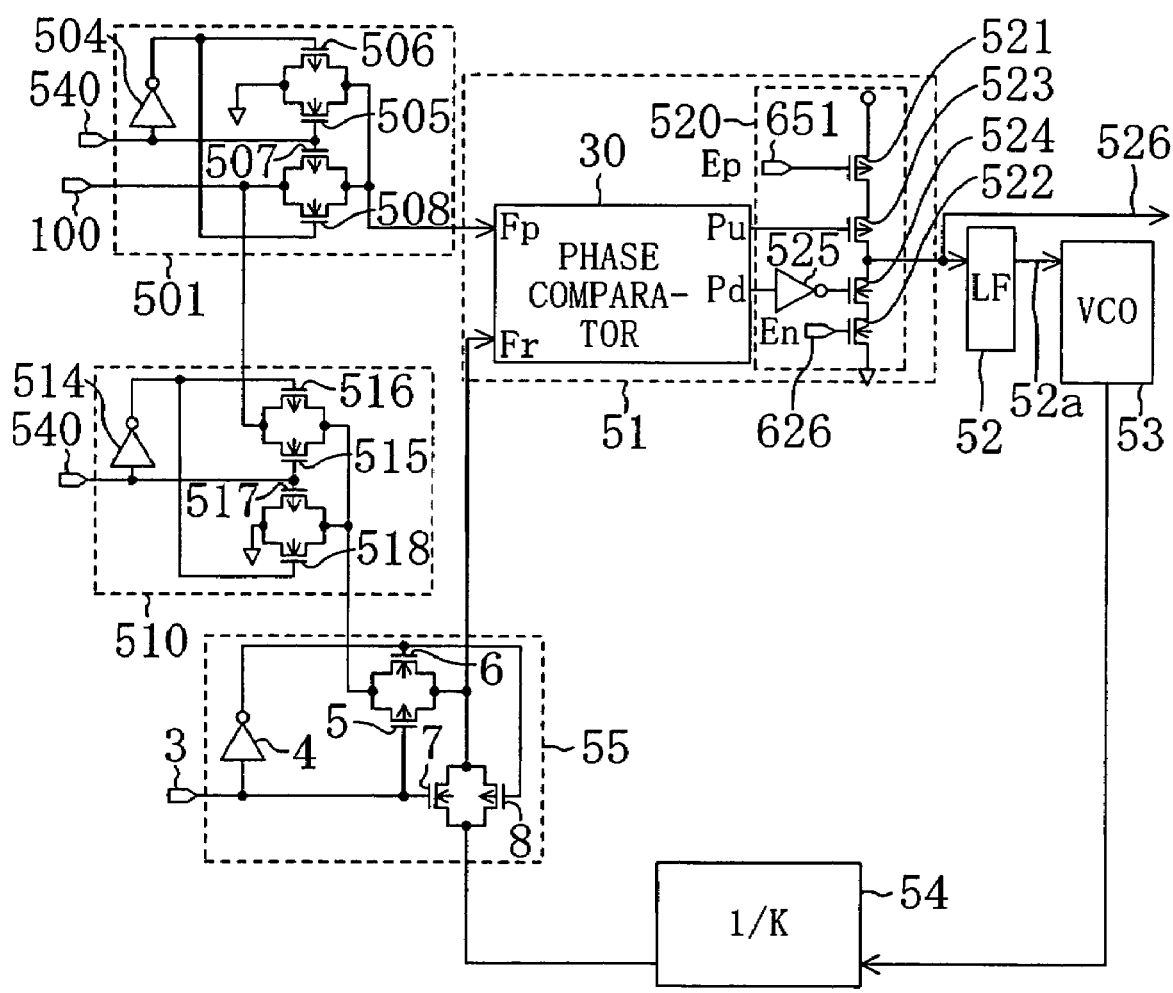
FIG. 6 is a circuit diagram showing the configuration of the PLL circuit in FIG. 5.

FIG. 6 is an example of the PLL circuit 500 according to the present invention. In FIG. 600, numeral 500 denotes a PLL circuit, which is made of a phase comparator 51, a loop filter 52, a voltage-controlled oscillator 53, and a programmable frequency divider 54. The output of the phase comparator 51 is connected to the loop filter 52, and the output 52a of the loop filter 52 is connected to the voltage-controlled oscillator. The voltage-controlled oscillator 53 converts its input voltage into a frequency. The clock signal that is output by the voltage-controlled oscillator 53 is connected to the programmable frequency divider 54. The switch circuit 55 is controlled by the feedback control signal 3, and when the feedback control signal 3 is "H," the Fr of the phase comparator 51 is connected to the programmable frequency divider 54, whereas when the feedback control signal 3 is "L," the Fr of the phase comparator 51 is connected to a switching circuit 510. Using an input switch control signal 540, the switching circuit 510 inputs the reference clock 100 into Fr of the phase comparator 51 only when the input switch control signal 540 is "H," and when it is "L," it pegs the Fr of the phase comparator 51 to ground. In this example of the switching circuit 510, numerals 515 and 518 denote N-type MOS transistors, and numerals 516 and 517 denote P-type MOS transistors. The MOS transistors 515 and 516 together constitute a transfer gate, as do the MOS transistors 517 and 518. Numeral 514 denotes an inverter. On the other hand, the reference clock Fp of the phase comparator 51 is connected to the switching circuit 501. Using the input switch control signal 540, the switching circuit 501 inputs the reference clock 100 into Fp of the phase comparator 51 only when the input switch control signal 540 is "L," and when it is "H," it pegs the Fr of the phase comparator 51 to ground. In this example of the switching circuit 501, numerals 505 and 508 denote N-type MOS transistors, and numerals 506 and 507 denote P-type MOS transistors. The MOS transistors 505 and 506 together constitute a transfer gate, as do the MOS transistors 507 and 508. Numeral 504 denotes an inverter. Furthermore, in FIG. 6, the phase comparator 51 is separated into a digital phase comparator 30 and a current charge pump circuit 520. The current charge pump circuit 520 is made of P-type MOS transistors 521 and 523, N-type MOS transistors 524 and 522, and an inverter 525. The source of the P-type MOS transistor 521 is connected to a power source, its gate is connected to an output terminal Ep 651 of the reference voltage circuit 600, and its drain is connected to the source of the P-type MOS transistors 523. Furthermore, the gate of the P-type MOS transistor 523 is connected to the Pu of the digital phase comparator 30. The source of the N-type MOS transistor 522 is connected to ground, its gate is connected to an output terminal En 626 of the reference voltage circuit, and its drain is connected to the source of the N-type MOS transistor 524. Furthermore, the gate of the N-type MOS transistor 524 is connected via the inverter 525 to the Pd of the digital phase comparator 30. The drains of the P-type MOS transistor 523 and the N-type MOS transistor 524 are connected to one another, and the charge pump output (current monitor) 526 is connected to the loop filter 52. By obtaining desired voltages from the reference voltage circuit 600 at En 626 and Ep 651, the current charge pump circuit 520 has the function to charge current to the loop filter 52 when Pu is "L," and to discharge current when Pd is "L."

Figure 7:
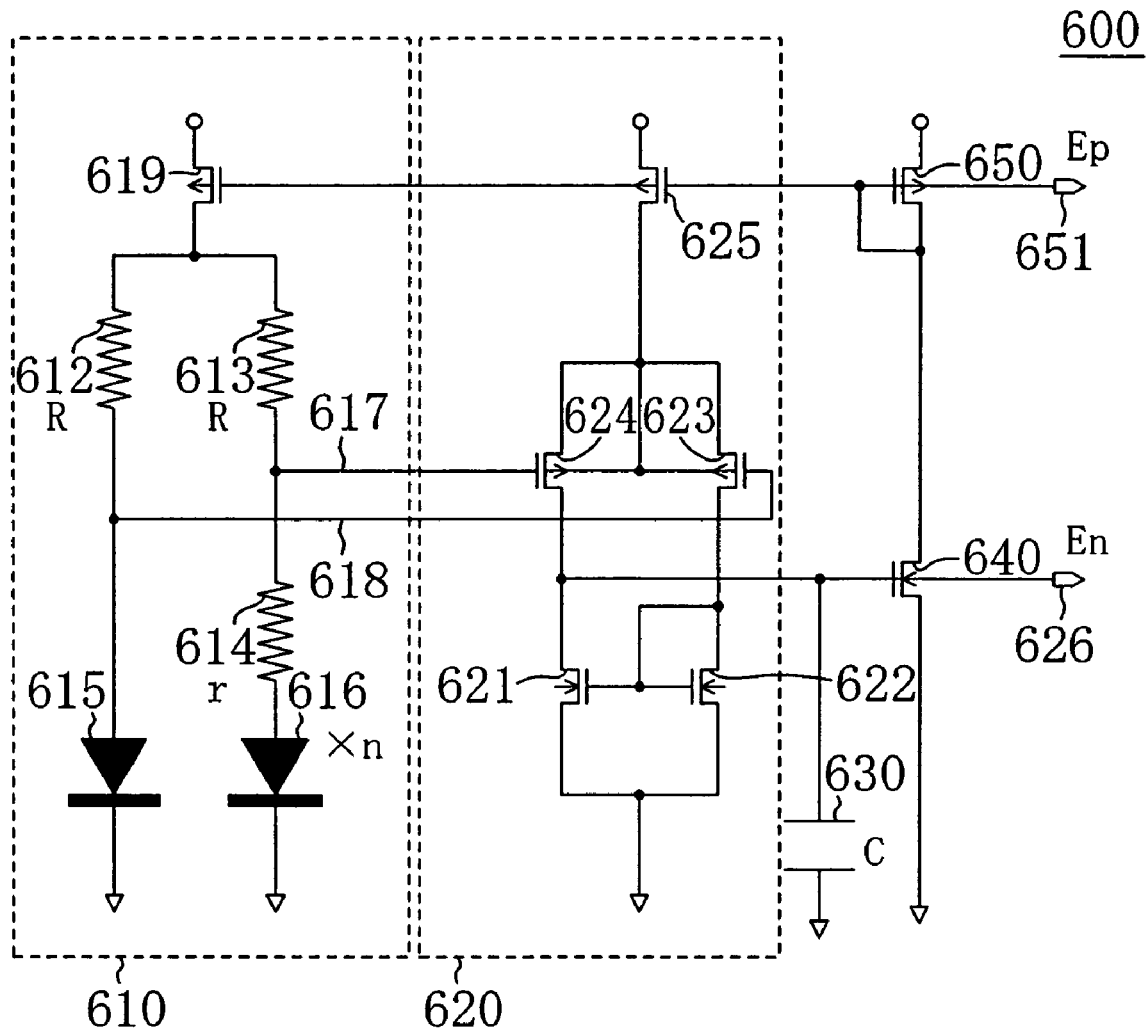
FIG. 7 is a circuit diagram showing the configuration of the reference voltage circuit in FIG. 5.

FIG. 7 shows the reference voltage circuit 600 used in FIG. 5. The reference voltage circuit 600 includes a band-gap generation circuit 610, an operational amplifier 620, a P-type MOS transistor 650, an N-type MOS transistor 640, and a capacitor 630. The band-gap generation circuit 610 includes a P-type MOS transistor 619, resistance elements 612, 613 and 614, and diodes 615 and 616. The resistance elements 612 and 613 have the same resistance values, which is R Ohm. Furthermore, the resistance element 614 has a resistance of r Ohm. The diode 616 includes n diodes connected in parallel, each of those diode being similar to the diode 615.

The operational amplifier 620 includes P-type MOS transistors 625, 624 and 623, and N-type MOS transistors 621 and 622. The reference voltage circuit 600 is a negative feedback circuit. With the operational amplifier 620, the reference voltage circuit 600 compares the voltages at the nodes 617 and 618, and adjusts the current flowing through the P-type MOS transistor 619 such that they attain the same potential. That is to say, when V2 is the voltage at 617, 12 is the current through 613, V1 is the voltage at 618, and I1 is the current through 612, then the following equations are given:

$$V1 = V2 \quad (1)$$

$$I1 \cdot R = I2 \cdot R \quad (2)$$

$$I1 = I2 \quad (3)$$

$$I1 = I_s \cdot (\exp(V1/(n \cdot Vt)) - 1) \quad (4)$$

Herein:

$$Vt = kT/q \quad (5)$$

$$I2 = 12 \cdot I_s \cdot (\exp(Vd/(n \cdot Vt)) - 1) \quad (6)$$

wherein q is the electron charge, k is the Boltzmann constant, and T is absolute temperature. When Vd is the voltage at the point where the resistor 614 and the diodes 616 are connected, then $$V1 = r \cdot I2 + Vd \quad (7)$$

$$n \cdot Vt \cdot \log(I1/I_s + 1) = R \cdot I1 + n \cdot Vt \cdot \log(I1/(12 \cdot I_s) + 1) \quad (8)$$

It follows from I1/Is>>1 that $$n \cdot Vt \cdot (\log(I1/I_s) - \log(I1/(12 \cdot I_s))) = R \cdot I1 \quad (9)$$

$$(n \cdot Vt \cdot \log 12)/R = I1 \quad (10)$$

That is to say, I1 is proportional to kT/q, and inversely proportional to the temperature characteristics of R. The capacitor 630 is for phase compensation of the negative feedback of the reference voltage circuit 600.

Figure 8:
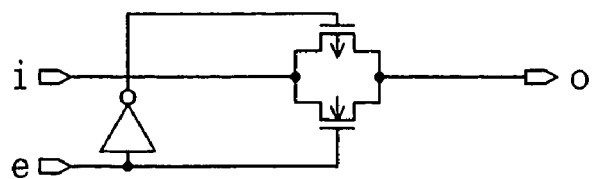
FIG. 8 is a circuit diagram showing the configuration of the switch circuits in FIG. 5.

FIG. 8 shows a configuration example of the switch circuit 930 in FIG. 5.

Figure 9:
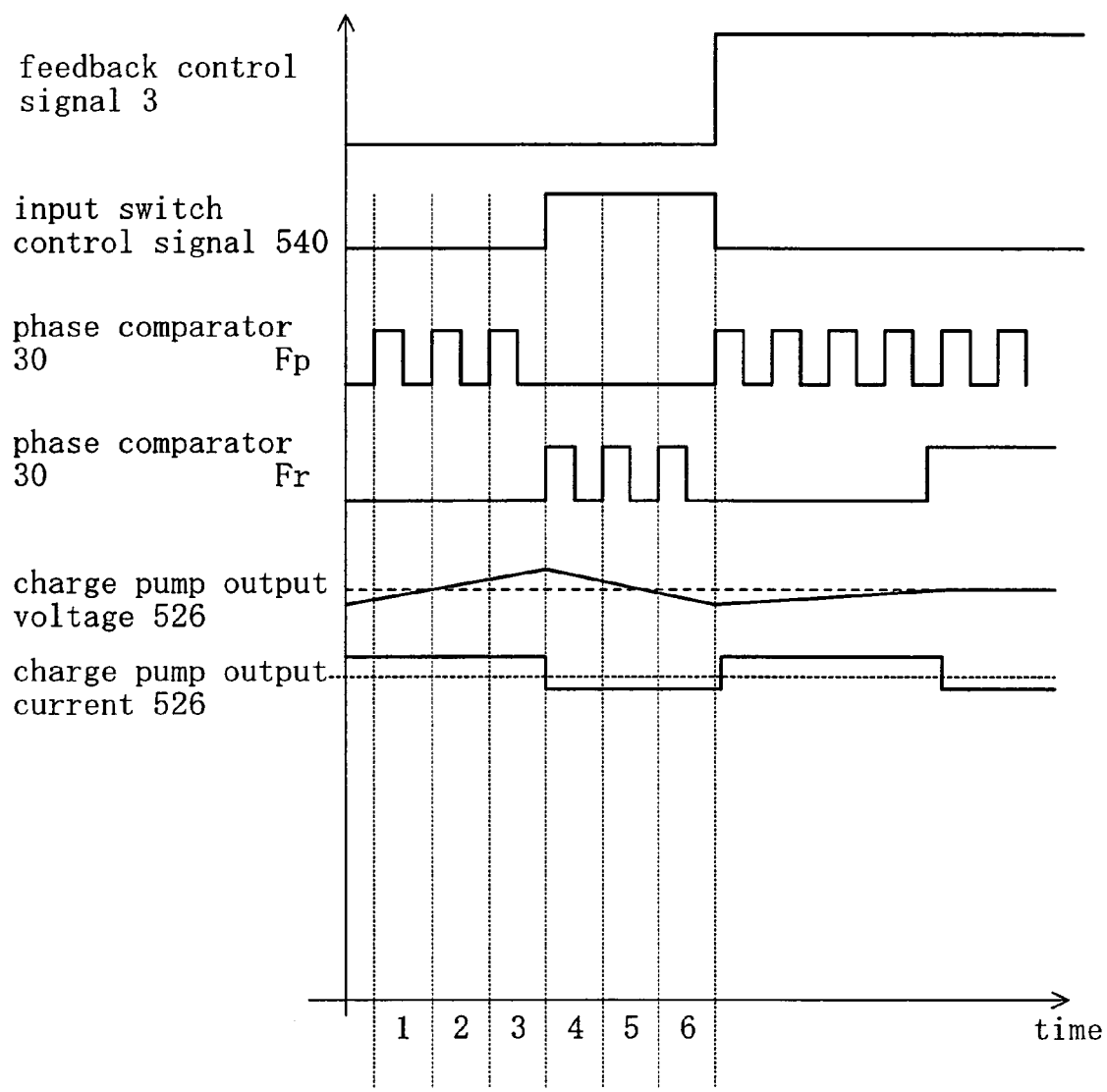
FIG. 9 is a timing chart illustrating the operation of the semiconductor integrated circuit in FIG. 5.

FIG. 9 is a timing chart illustrating the operation of FIG. 6 and FIG. 7. In FIG. 9, the horizontal axis denotes time, and the vertical axis denotes the voltage values of the feedback control signal 3, the input switching signal 540, Fp and Fr of the digital phase comparator, and the charge pump output 526. Before the operation of the PLL circuit 500, the feedback control signal 3 is "L," shutting off the feedback loop. Then, by setting the input switch control signal 540 to "L," the reference clock 100 is input into Fp of the digital phase comparator 30, and Fr is pegged to "L." The output voltage of the current charge pump circuit 520 rises up to the third clock period, and constantly supplies a current. By monitoring this current or voltage, it can be detected whether the phase comparator 51 and the reference voltage circuit 600 operate normally.

More specifically, if the capacitor 630 of the reference voltage circuit 600 does not have the proper capacitance but has been fabricated smaller than intended, so that there is no phase margin in the loop of the feedback system of the reference voltage circuit 600, and this reference voltage circuit 600 oscillates, then the voltages at En 626 and Ep 651 ordinarily have a certain amplitude. In this situation, the current charge pump circuit 520 supplies a current corresponding to the voltage amplitude. When the voltage of the charge pump output 526 is monitored in this case, then ripples occur. These ripples are detected by the ripple detection circuit 900, the incremental counter is incremented, and the reference voltage circuit 600 performs a stabilizing operation by increasing the capacitance such that ripples do not occur, In this example, it was assumed that the capacitor 630 does not have the appropriate value, but if the reference voltage circuit 600 oscillates, it is also possible to achieve a stable operation from the oscillation when the capacitor 630 has the appropriate value with the above-described configuration.

EMBODIMENT 3

Figure 10:
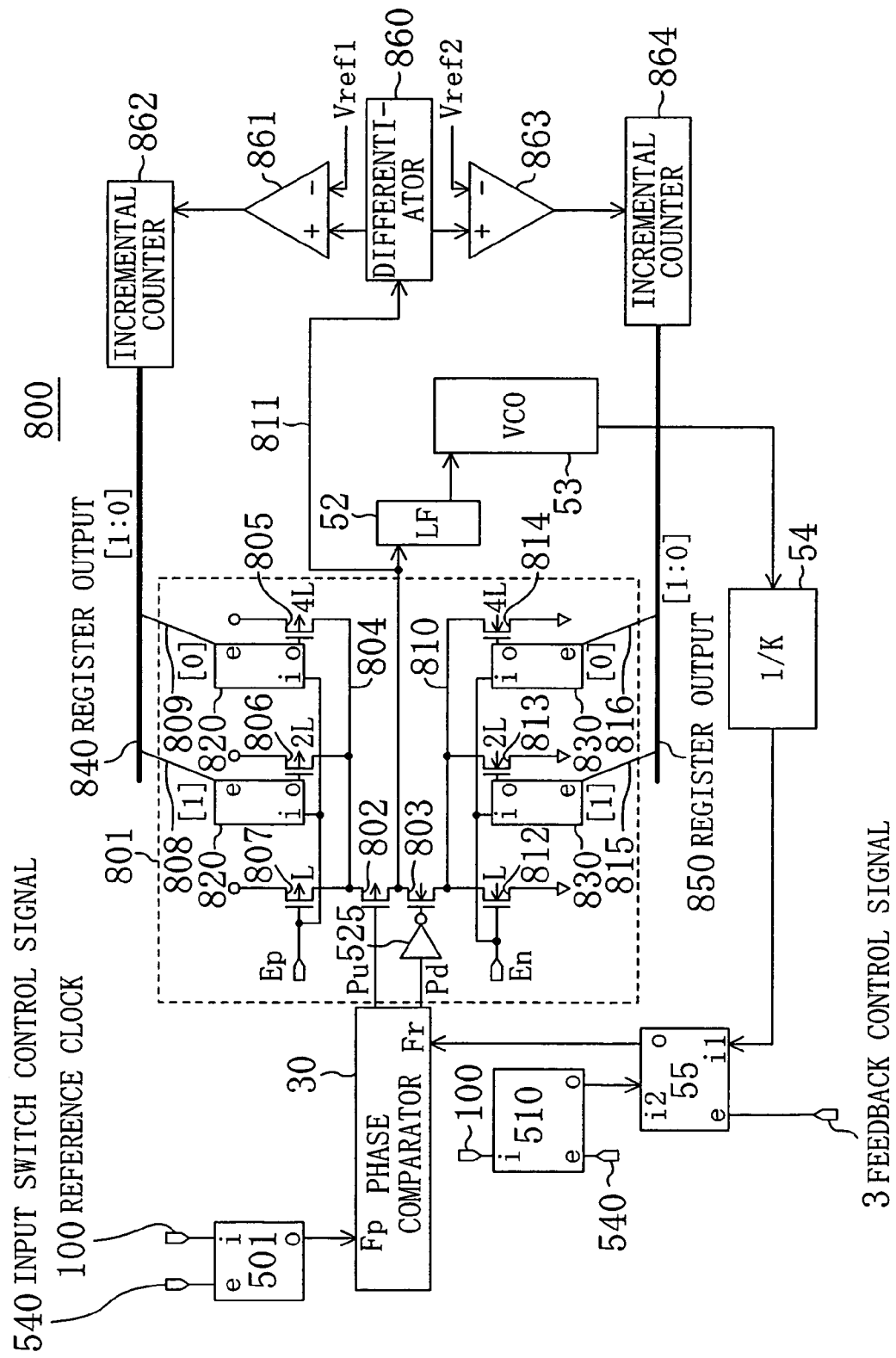
FIG. 10 is a block diagram of a semiconductor integrated circuit in accordance with a third embodiment of the present invention.

FIG. 10 is an example of a semiconductor integrated circuit according to the present invention. The PLL circuit 800 in FIG. 10 is almost the same as the one in FIG. 6, and differs only with regard to the current charge pump circuit 801. The current charge pump circuit 801 in FIG. 10 is almost the same as the current charge pump circuit 520 in FIG. 6, but the drains of P-type MOS transistors 806 and 805 are connected to the point 804 connecting the P-type MOS transistors 807 and 802. The gate lengths of the P-type MOS transistors 806 and 805 are respectively two times and four times that of the P-type MOS transistor 807, and the various gates are controlled, by bit signals 808 and 809 of a 2-bit register circuit output bus 840. The gates are connected to switch circuits 820 that are connected to Ep 651 when those bit signals are "H." and to a power source when the bit signals are "L." Furthermore, the drains of N-type MOS transistors 813 and 814 are connected to the point 810 connecting the N-type MOS transistors 803 and 812. The gate lengths of the N-type MOS transistors 813 and 814 are respectively two times and four times that of the N-type MOS transistor 812, and the various gates are controlled by bit signals 815 and 816 of a 2-bit register circuit output bus 850. The gates are connected to switch circuits 830 that are connected to En 626 when those bit signals are "H," and to ground when the bit signals are "L." The various bits on the register circuit output buses 840 and 850 are generated from a charge pump output 811 by a voltage differentiating circuit 860, operational amplifiers 861 and 863, and incremental counters 862 and 864. Vref1 is an upper limiting voltage, and Vref2 is a lower limiting voltage. It should be noted that it is also possible to carry out the generation of the bits for the respective register circuit output buses 840 and 850 from the charge pump output 811 with a tester provided outside the semiconductor integrated circuit.

Figure 11:
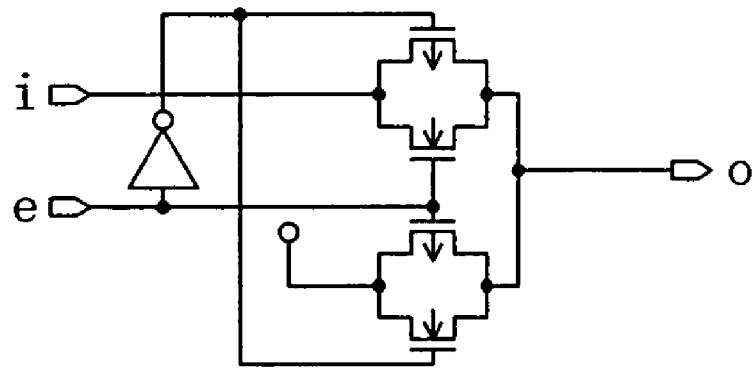
FIG. 11 is a circuit diagram showing the configuration of switch circuits in FIG. 10.
Figure 12:
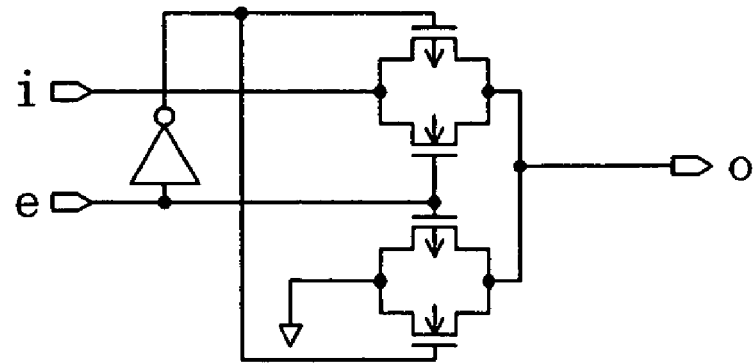
FIG. 12 is a circuit diagram showing the configuration of other switch circuits in FIG. 10.

FIG. 11 shows a configuration example of the switch circuits 820 in FIG. 11, and FIG. 12 shows a configuration example of the switch circuits 830 in FIG. 10.

Figure 13:
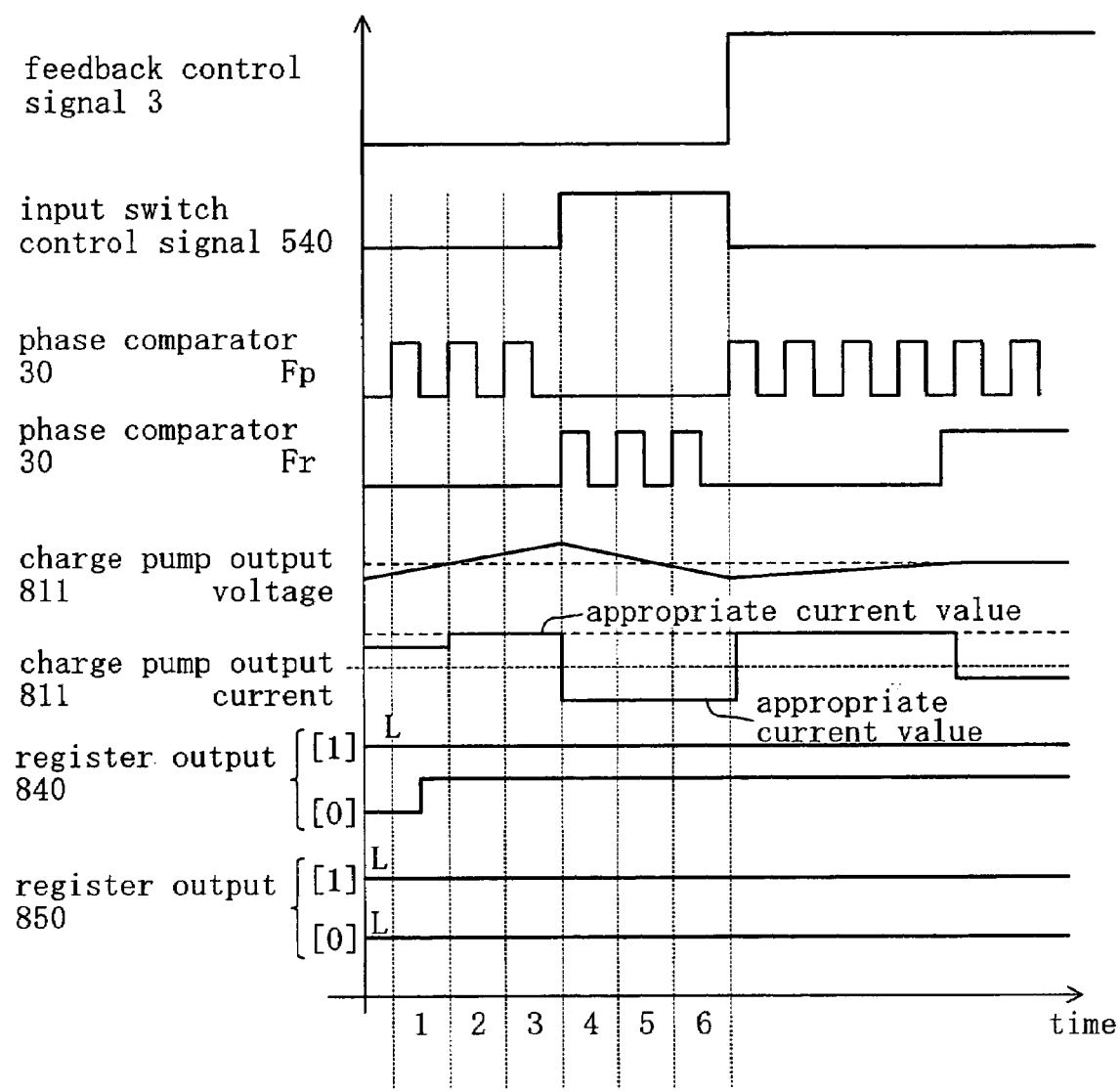
FIG. 13 is a timing chart illustrating the operation of the semiconductor integrated circuit in FIG. 10.

FIG. 13 is a timing chart illustrating the operation of FIG. 10. In FIG. 13, the horizontal axis denotes time, and the vertical axis denotes the voltage values of the feedback control signal 3, the input switching signal 540, Fp and Fr of the digital phase comparator 30, and the charge pump output 511, as well as the current value of the charge pump 811. FIG. 13 illustrates the case that the characteristics of the P-type MOS transistor 807, which serves as the current source for the current charge pump circuit, are poor. Before the operation of the PLL circuit, the feedback control signal 3 is "L," shutting off the feedback loop. Then, by setting the input switch control signal 540 to "L," the reference clock 100 is input into Fp of the digital phase comparator 30, and Fr is pegged to "L." The voltage 811 of the current charge pump circuit 801 rises up to the third clock period, and constantly supplies a current. However, in the first period, the current value of the current charge pump circuit 801 is smaller than the appropriate current value. Thus, the register output 840 is shifted, and by setting "00" to "01", the current value of the current charge pump circuit 801 assumes the appropriate value in the second period. Furthermore, by setting the input switch control signal 540 to "H" in the fourth period, the reference clock signal 100 is input into Fr of the digital phase comparator 30, and Fp is pegged to "L." The voltage 811 of the current charge pump circuit 801 decreases, and the current is constantly discharged. Since the current value is already appropriate in the fourth period, the register output 850 is sustained at "00". Thus, it is possible to attain an appropriate current value by monitoring this charge pump circuit, and adjusting the current source of the charge pump circuit with the incremental counters 862 and 864, and thus it becomes possible to reduce tiny current variations, such as those caused by process variations. It should be noted that this example has been explained only for a P-type MOS transistor, but a similar approach is also suitable for deterioration of N-type MOS transistors, that is, for discharge.

EMBODIMENT 4

Figure 14:
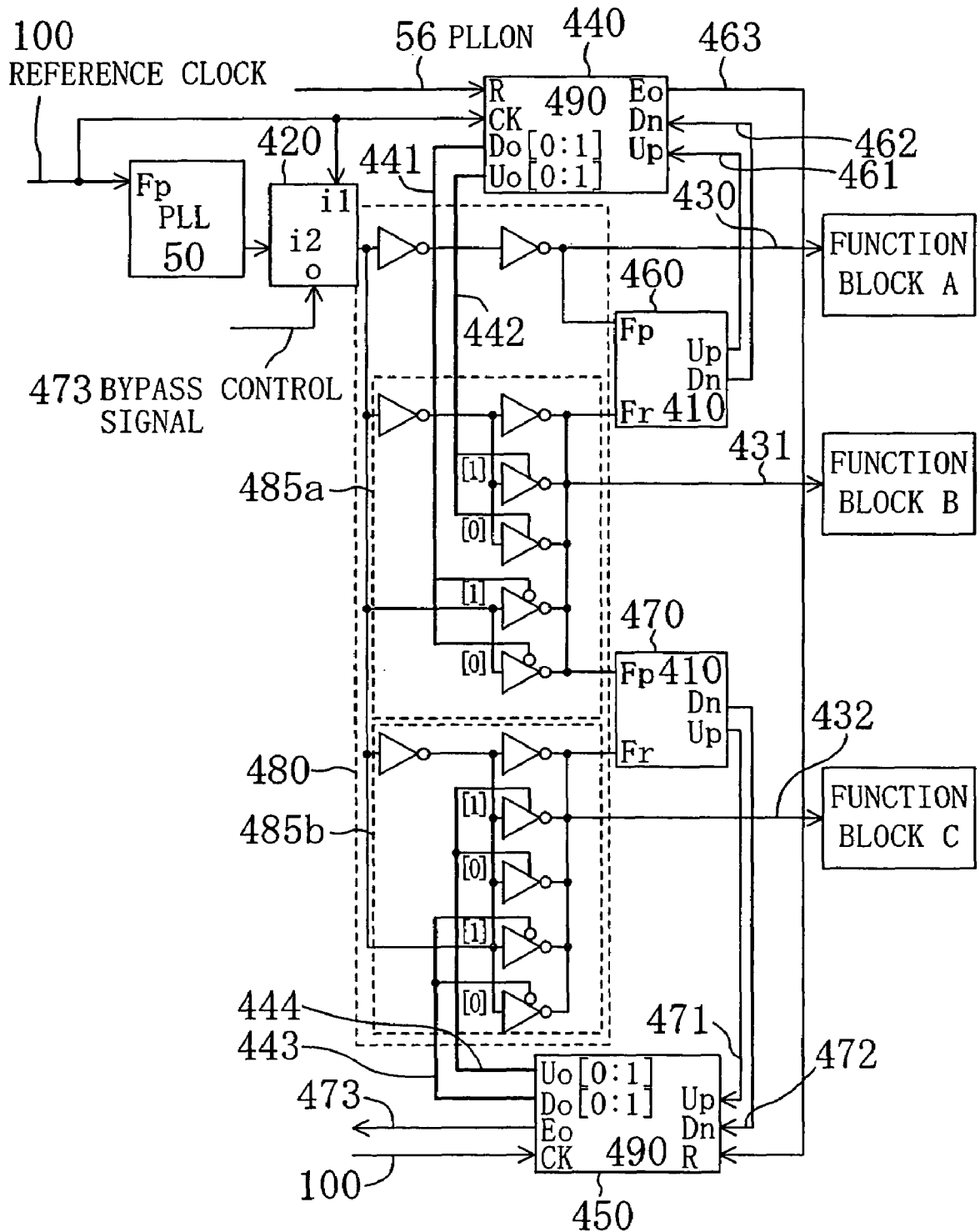
FIG. 14 is a block diagram of a semiconductor integrated circuit in accordance with a fourth embodiment of the present invention.

FIG. 14 illustrates another example of a semiconductor integrated circuit in accordance with the present invention. Numeral 400 denotes a semiconductor integrated circuit in accordance with the present invention. Numeral 480 denotes a clock distribution circuit connected to a switch circuit 420. In response to a bypass control signal 473, the switch circuit 420 switches between the reference clock 100 that is input into a PLL circuit 50 and the clock that has been multiplied with a PLL circuit 50. The clock distribution circuit 480 distributes clocks over the clock lines 430, 431 and 432 to function blocks A, B and C. Respective drivers 485a and 485b of the clock lines 431 and 432 have the function to increase or decrease the driver intensity with corresponding output buses 441, 442, 443 and 444 of control register circuits 490. The respective clock lines 430, 431 and 432 are connected to phase detectors 410 detecting rising edges, one of which is a phase detector 460 detecting phase differences between the clock lines 430 and 431, and supplying an up signal 461 and a down signal 462 to one control register circuit 440. The other one is a phase detector 470 detecting phase differences between the clock lines 431 and 432, and supplying an up signal 471 and a down signal 472 to the other control register circuit 450. Numeral 463 denotes a comparison termination signal that is applied by the one control register circuit 440 to the other control register circuit 450.

Figure 15:
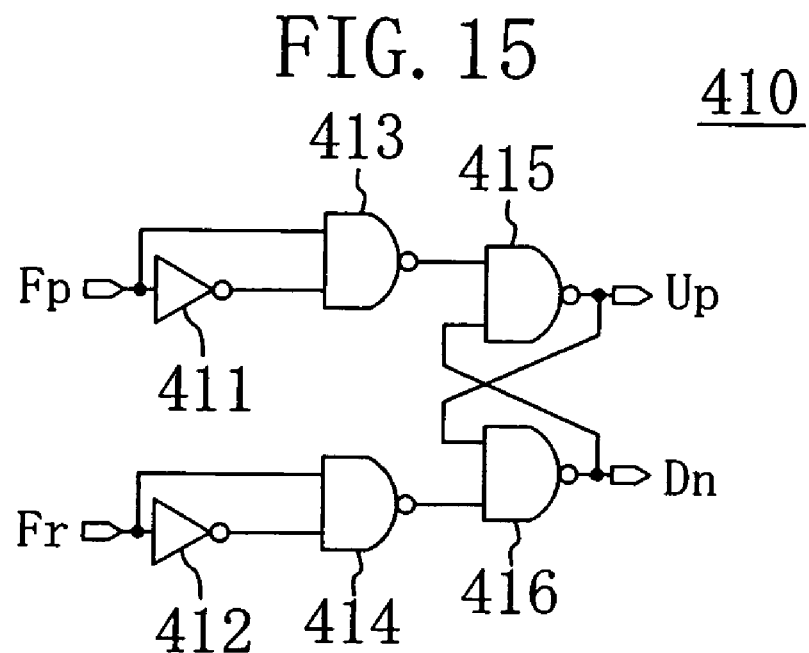
FIG. 15 is a circuit diagram showing the configuration of the phase comparator in FIG. 14.

FIG. 15 is an example of the phase comparator 410, which is made of input ports Fp and Fr, inverters 411 and 412, 2-input NAND circuits 413, 414, 415 and 416, and output ports Up and Dn. The reference clock is input from Fp, and is input into the inverter 411 and the NAND circuit 413. Furthermore, also the output from the inverter 411 is input into the NAND circuit 413. The clock to be compared is input from Fr, and is input into the inverter 412 and the NAND circuit 414. Furthermore, also the output from the inverter 412 is input into the NAND circuit 414. The 2-input NAND circuits 415 and 416 constitute an R-S latch circuit, which detects falling edges in the output of the NAND circuits 413 and 414. If the rising edge of Fr lags behind the rising edge of Fp, then the Up output becomes "H" for the time of that phase difference delay. If the rising edge of Fr leads the rising edge of Fp, then the Dn output becomes "L" for the time of that phase difference delay.

Figure 16:
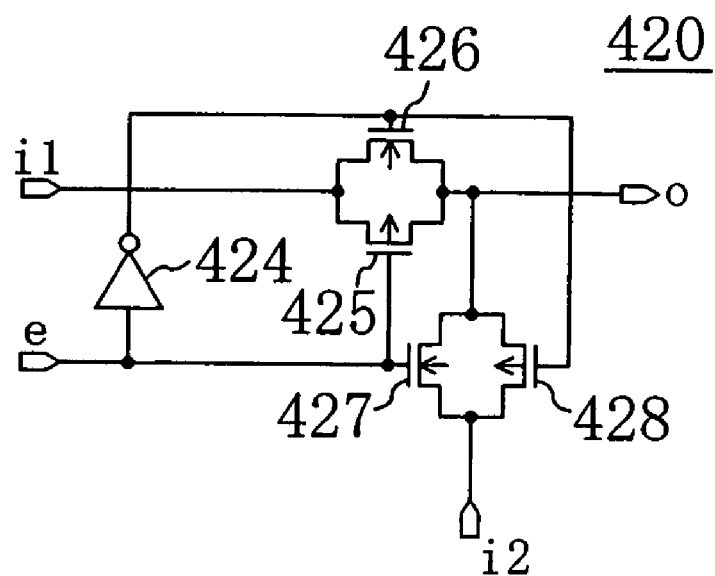
FIG. 16 is a circuit diagram showing the configuration of the switch circuit in FIG. 14.

FIG. 16 is an example of the switch circuit 420, which is made of a control signal port e, two input ports i1 and i2, an output port o, an inverter 424, P-type MOS transistors 425 and 428, and N-type MOS transistors 426 and 427. When the input port e is "H," then i2 is output at output port o, and when the input port e is "L," then i1 is output at output port o.

Figure 17:
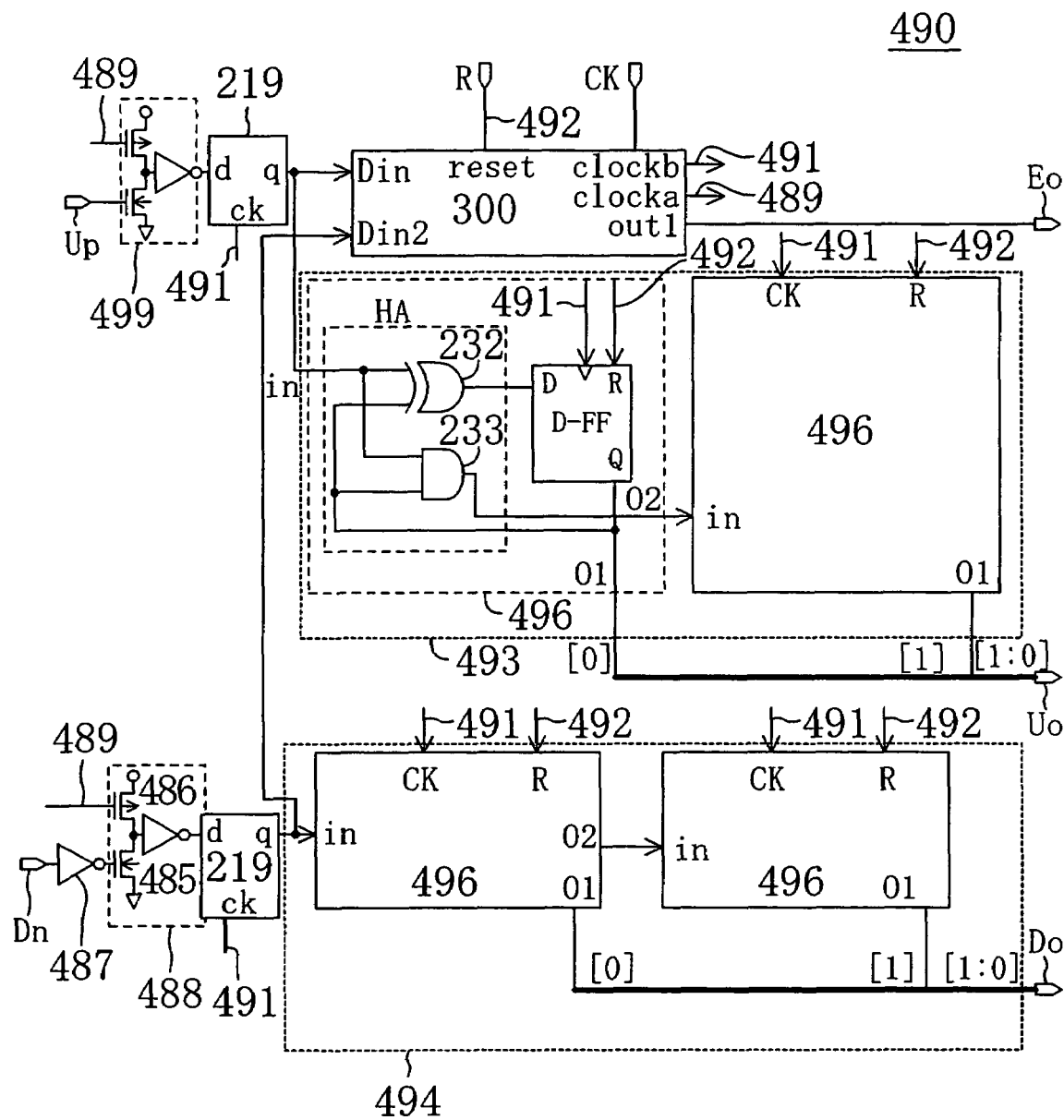
FIG. 17 is a block diagram showing the configuration of the register control circuit in FIG. 14.

FIG. 17 shows an example of the control register circuit 490. The control register circuit 490 is made of a comparison termination detection circuit 300, incremental registers 493 and 494, input ports R, CK, Up, Dn, and output ports Eo, Uo and Do. The input port R reset signal 492 is connected to the input ports R of the comparison termination detection circuit 300 and the incremental registers 493 and 494. The input port CK is input into the comparison termination detection circuit 300, and the input port Up is input via a dynamic circuit 499 into an input port in of the incremental register 493 and an input Din of the comparison termination detection circuit 300. Input port Dn is connected via an inverter 487 and a dynamic circuit 488 to input port in of the incremental register 494 and input port Din2 of the comparison termination detection circuit 300. In the dynamic circuit 488, numeral 485 denotes an N-type MOS transistor, and numeral 486 denotes a P-type MOS transistor. Output port Eo is connected to out1 of the comparison termination detection circuit 300, output port Uo is connected to output ports O1 and O2 of the incremental register 493, and output port Do is connected to output ports O1 and O2 of the incremental register 494. The incremental registers 493 and 494 are made of a serial connection of 1-bit incremental registers 496, which include a HA and a flip-flop with reset. The 1-bit incremental registers 496 have input ports in, CK and R, and output ports O2 and O1. A clock 491 is input into CK, and the reset signal 492 is input into R. The output port O1 is the output of the flip-flop, whereas O2 is a carry signal.

Figure 18:
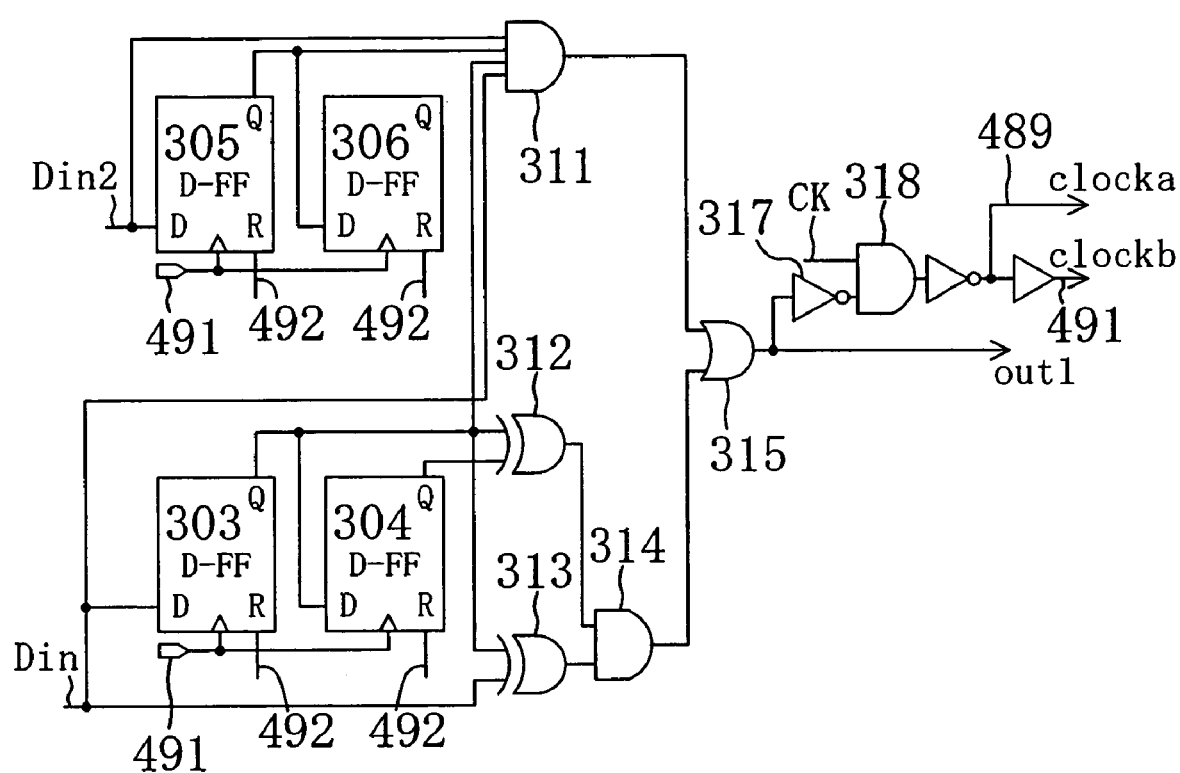
FIG. 18 is a circuit diagram showing the configuration of the ripple detection termination circuit in FIG. 17.

The comparison termination detection circuit 300 is very similar to the ripple elimination termination circuit 220 of Embodiment 1, and FIG. 18 shows an example. The comparison termination detection circuit 300 in FIG. 18 includes flip-flops 303, 304, 305 and 360 with reset, EXOR circuits 312 and 313, a 4-input AND circuit 311, AND circuits 314 and 318, an OR circuit 315 and an inverter 317. When the states of the Up signal and the Dn signal, which are the signals input into the control register circuits 490 do not change within two periods of the reference clocks, or when the Up signal and the Dn signal have changed to different states within three periods, then a comparison termination signal (Eo) is output from out1, the clocks (clocka and clockb) 489 and 491 that are used within the control register circuits 490 are stopped, and the respective contents of the incremental registers 493 and 494 are hold.

Figure 19:
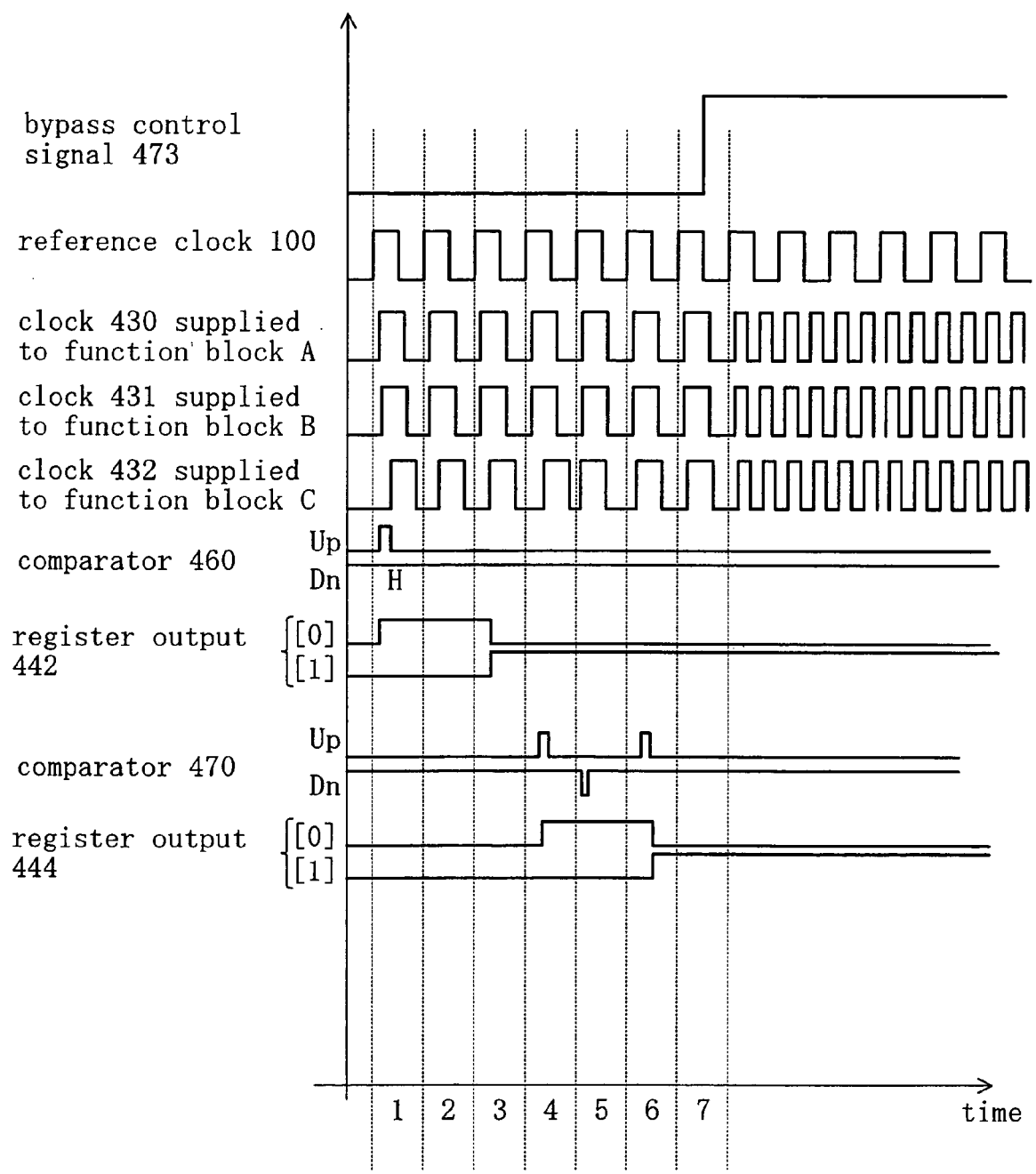
FIG. 19 is a timing chart illustrating the operation of the semiconductor integrated circuit in FIG. 14.

FIG. 19 is a timing chart illustrating FIGS. 14, 15 and 17. In FIG. 19, the horizontal axis denotes time, and the vertical axis denotes the voltage values of various signals, namely the bypass control signal 473, the reference clock 100, the clock signal line 430 supplied to function block A, the clock signal line 431 supplied to function block B, the clock signal line 432 supplied to function block C, the output ports Up and Dn of the phase comparator 460, the output ports Up and Dn of the phase comparator 470, the output bus of the control register circuit 440, and the output bus of the control register circuit 450. In this example, the rising edge of the clock signal line 431 supplied to the function block B lags behind the rising edge of the clock signal line 430 supplied to the function block A, and the rising edge of the clock signal line 432 supplied to the function block C lags behind the rising edge of the clock signal line 431 supplied to the function block B. First, when the PLL circuit starts its stabilizing operation, the PLLON signal 56 is turned from "L" to "H," and the reset signals of the control register circuits 440 and 450 are released. The bypass control signal 473 is "L," and the PLL circuit 50 performs an internal feedback loop control and starts preparations for the stabilization operation.

The reference clock 100 is supplied to the clock distribution circuit 480, and the clock phase difference between the clock signal lines 430 and 431 is detected by the phase detector 460. During the first period, the rising edge of the clock on 431 lags behind that of 430, so that the Up output of the phase comparator 460 becomes "H." Thus, the first bit Uo[0] of the incremental register 493 of the control register circuit 440 becomes "H," strengthening the driver 485a for the clock line 431. During the second period, there is no phase difference between the clock lines 430 and 431, and the Up output of the phase comparator 460 stays "L," and the Dn output stays "H." Also in the third period, there is no phase difference between the clock lines 430 and 431, so that clock distribution without phase difference is possible. Then, the control register circuit 440 outputs the comparison termination signal 463, and the reset of the control register circuit 450 is released. Next, the phase comparator 470 starts to compare the phase difference between the clock lines 432 and 431. During the fourth period, the Up output of the phase comparator 470 becomes "H." Thus, the first bit Uo[0] of the incremental register 493 of the control register circuit 450 becomes "H," strengthening the driver 485b for the clock line 432. During the fifth period, the Dn output of the phase comparator 470 is "L," and the first bit Do[0] of the incremental register 494 of the control register output 450 becomes "H" (not shown in the drawings), reducing the capability of the driver 485b of the clock line 432. During the sixth period, the Up output of the phase comparator 470 again becomes "H." The phase difference between the clock lines 432 and 431 cannot be made any smaller than that, so that the control register circuit 450 outputs the comparison termination signal 463, the bypass control signal 473 becomes "H" in the seventh period, and the output signal of the PLL circuit 50 is supplied from the clock distribution circuit 480 to the function blocks.

Thus, before the PLL circuit 50 starts its stabilizing operation, clock skewing of the function blocks can be eliminated by adjusting the strength of the clock drivers 485a and 485b of the clock distribution circuit 480, so that it becomes possible to adjust the clock phases of the semiconductor integrated circuit 400 with high precision.

EMBODIMENT 5

Figure 20:
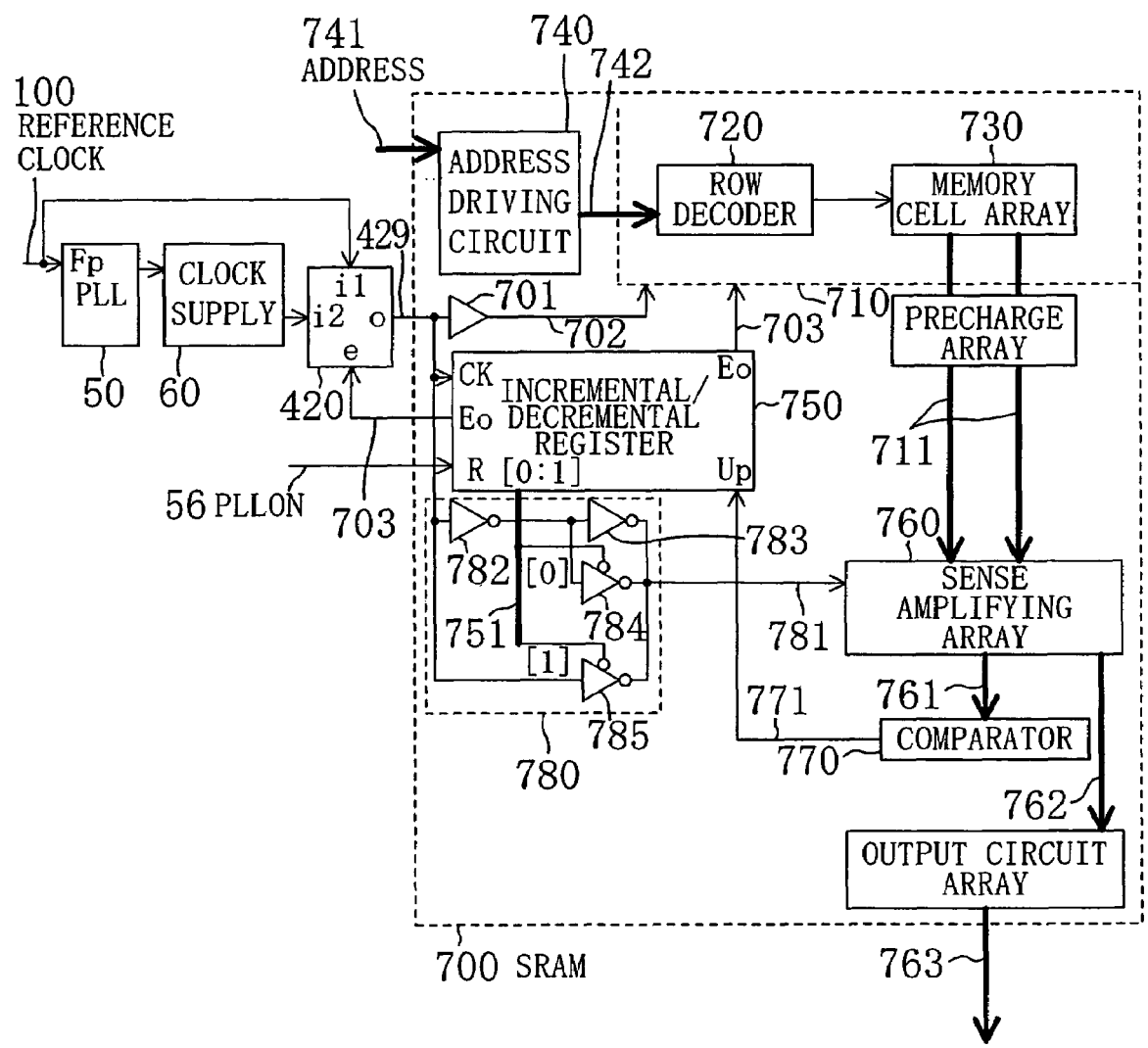
FIG. 20 is a block diagram of a semiconductor integrated circuit in accordance with a fifth embodiment of the present invention.

FIG. 20 is an example of another semiconductor integrated circuit according to the present invention, which includes a PLL circuit 50 operated with a reference clock 100, a clock supply circuit 60, a switch circuit 420, and an SRAM (static random access memory) circuit 700. The clock supply circuit 60 is connected to the output of the PLL circuit 50. Using a bypass control signal 703, the switch circuit 420 switches between the reference clock 100 and the output of the clock supply circuit 60. The SRAM circuit 700 is synchronized with the output of the switch circuit 420. The SRAM circuit 700 has an address 741 as an input port, and an SRAM data output 763 and a bypass control signal 703 as output ports. Furthermore, he SRAM circuit 700 includes an address driving circuit 740, a memory access circuit 710, a precharge array, a sense amplifier array 760, a comparator 770, an incremental/decremental register 750, and a sense amplifier activation signal generation circuit 780. The address driving circuit 740 drives an address signal line 742 in correspondence with an address 741. The memory access circuit 710 is made of a memory cell array 730 and a row decoder array 720. The precharge array precharges a bit line pair 711 of the memory cell array 730 the sense amplifier array 760 amplifies the voltage of the bit line pair 711. The comparator 770 compares the output 761 of the sense amplifier array 760 with a reference voltage. The incremental/decremental register 750 stores the state of the output 771 of the comparator 770 in synchronization with the reference clock 100. The sense amplifier activation signal generation circuit 780 controls the delay time of an activation signal 781 for the sense amplifier array 760 with the output state of the incremental/decremental register 750. The output of the switch circuit 420 is given via a buffer 701 and a buffer output signal line 702 to the memory access circuit 710, and via the sense amplifier activation signal generation circuit 780 to the sense amplifier array 760. Numerals 782, 783, 784 and 785 are delay circuits (inverters) in the sense amplifier activation signal generation circuit 780. The output 762 of the sense amplifier array 760 passes through an output circuit array before becoming the SRAM data output 763.

Figure 21:
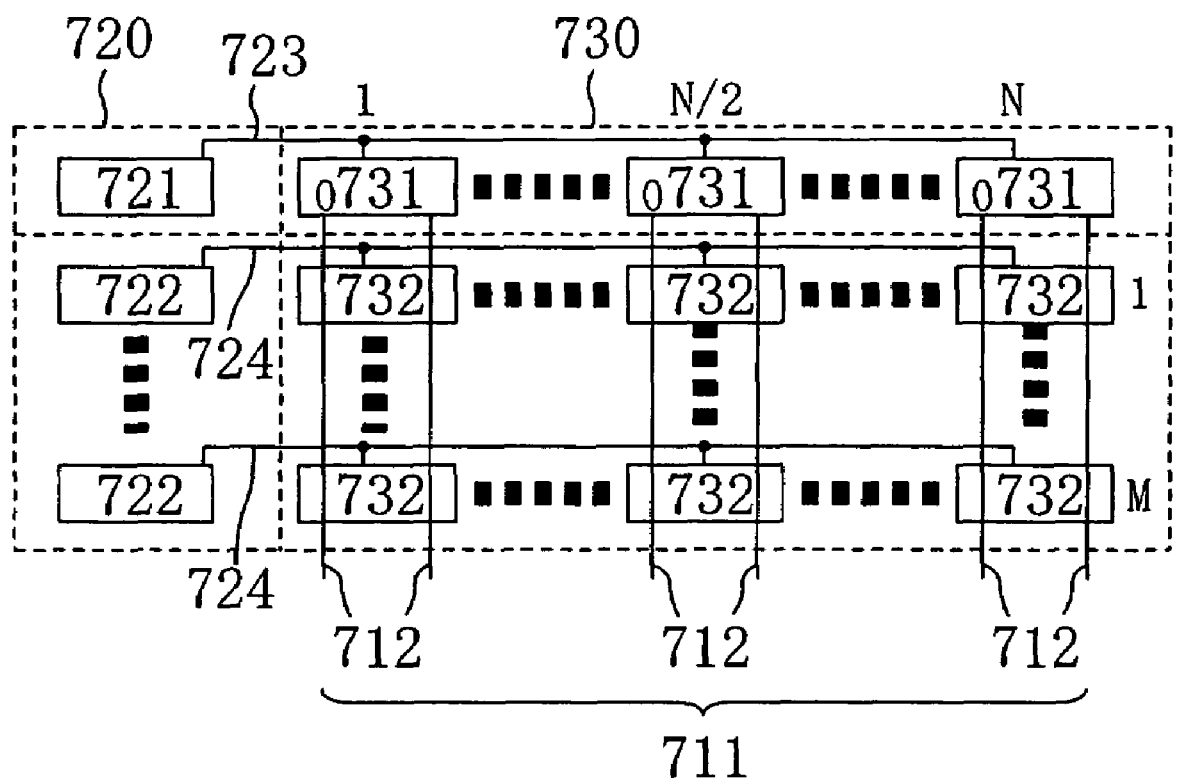
FIG. 21 is a block diagram showing the configuration of a memory access circuit in FIG. 20.
Figure 22:
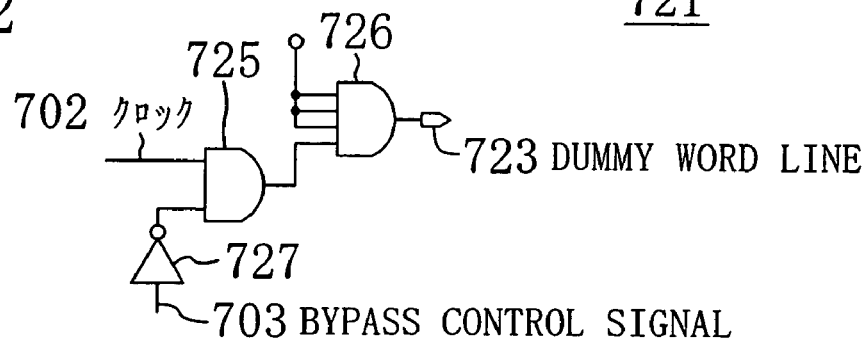
FIG. 22 is a circuit diagram showing the configuration of the dummy row decoder in FIG. 21.
Figure 23:
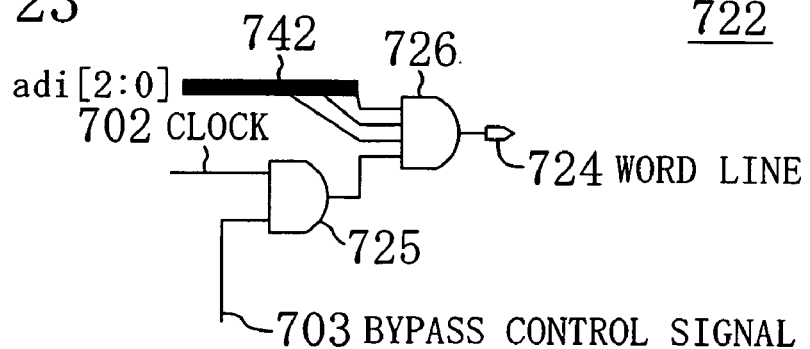
FIG. 23 is a circuit diagram showing the configuration of the normal row decoders in FIG. 21.

FIG. 21 is an example of the memory access circuit 710. The memory access circuit 710 includes a dummy memory cell array having N columns of dummy memory cells 731, a row decoder 721 (see FIG. 22), a memory cell array 730 made of N columns×M rows of memory cells 732, and M row decoders 722 (see FIG. 23). The row decoder 721 constantly activates the dummy word line 723 in synchronization with the clock when the bypass control signal 703 is inactivated. The row decoders 722 activate the respective word lines 724 with the status of the address 741 in synchronization with the clock when the bypass control signal 703 is activated. In FIGS. 22 and 23, numeral 725 denotes an AND circuit, numeral 726 denotes a decoding circuit, and numeral 727 denotes an inverter.

Figure 24:
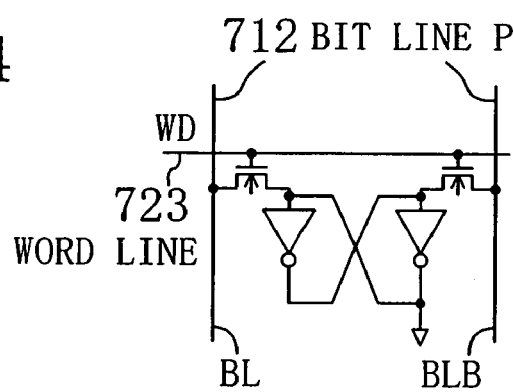
FIG. 24 is a circuit diagram showing the configuration of the dummy memory cells in FIG. 21.

The dummy memory cells 731 are circuits as shown in FIG. 24, and have the function to transmit the bit information "0" within the memory cell to a bit line pair (BL, BLB) 712 when the word line (WD) 723 is activated.

Figure 25:
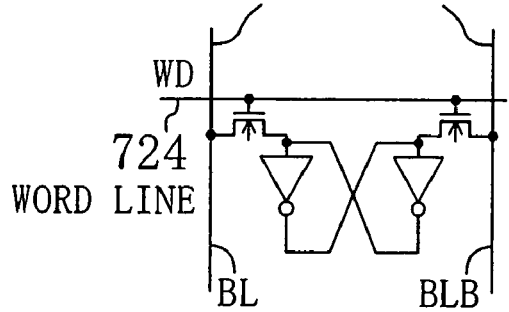
FIG. 25 is a circuit diagram showing the configuration of the normal memory cells in FIG. 21.

The regular memory cells 732 are circuits as shown in FIG. 25, and have the function to transmit the bit information within the memory cell to the bit line pair (BL, BLB) 712 when the word line (WD) 724 is activated.

Figure 26:
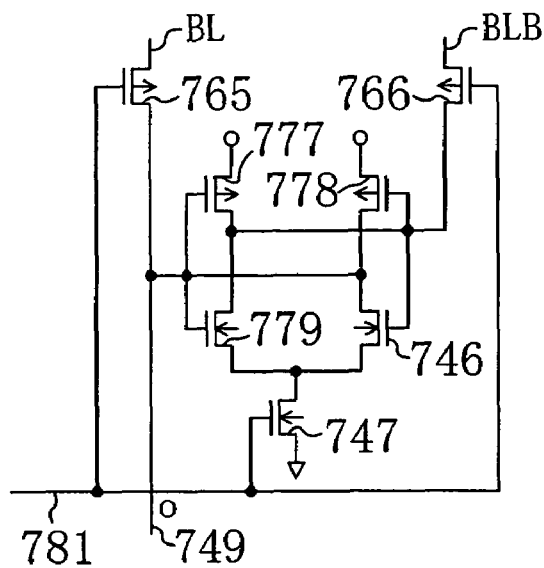
FIG. 26 is a circuit diagram showing the unit configuration of the sense amplifying array in FIG. 20.

FIG. 26 shows a sense amplifying circuit 764 that constitutes one bit portion of the sense amplifying array 760. The sense amplifying circuit 764 in FIG. 26 includes N-type MOS transistors 746, 747 and 779, as well as P-type MOS transistors 765, 766, 777 and 778, and a sense amplifier output line 749.

Figure 27:
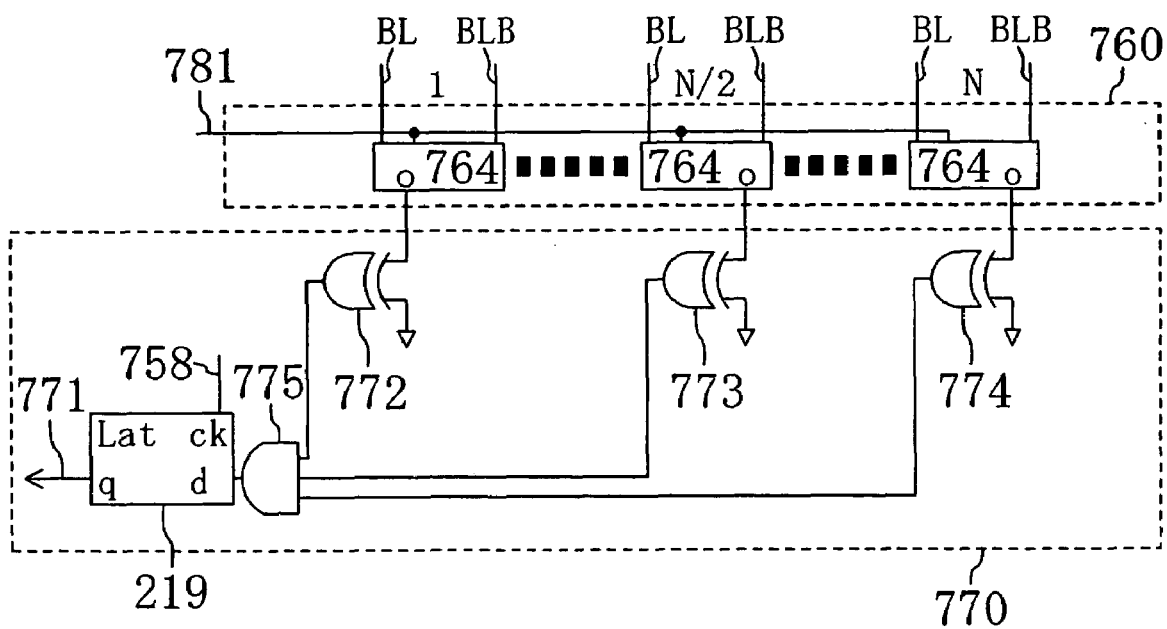
FIG. 27 is a circuit diagram showing the configuration of the comparator in FIG. 20.

FIG. 27 is an example of the comparator 770. The EXOR circuits 772, 773 and 774 compare the ground signal (expectation value) with the output o of the sense amplifying circuits 764 in the sense amplifying array 760 connected to the first column, the N/2-th column and the N-th column of the dummy memory cell array. The output of the EXOR circuits 772, 773 and 774 is input into a 3-input AND circuit 775, and a comparison output signal 771 is obtained from a latch 219 that operates in synchronization with a clock 758.

Figure 28:
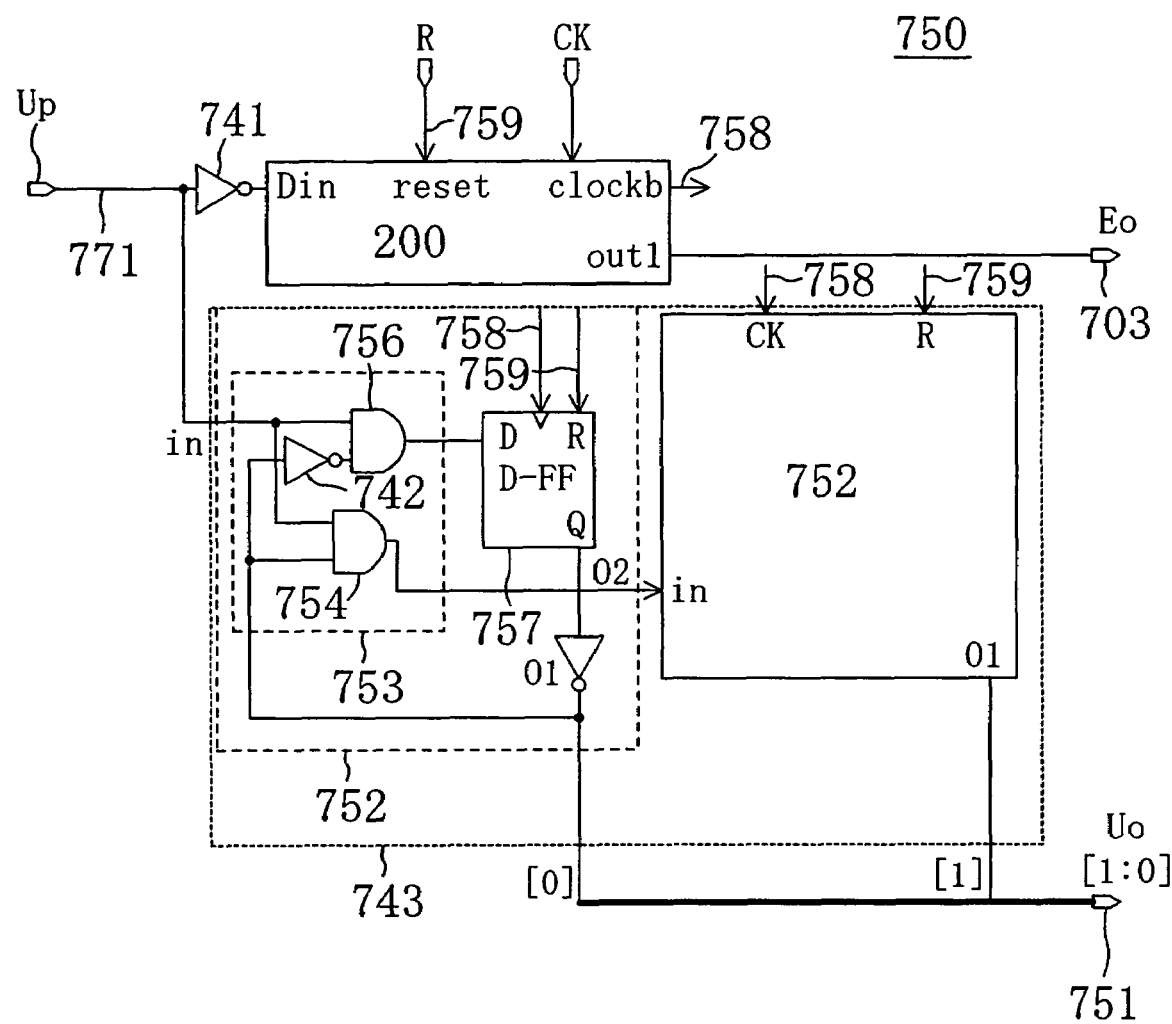
FIG. 28 is a block diagram showing the configuration of the incremental/decremental register in FIG. 20.

FIG. 28 is an example of the incremental/decremental register 750. The incremental/decremental register 750 is made of an inverter 741, a phase comparison termination circuit 200, a 2-bit incremental/decremental register 743, input ports R, CK, Up, and output ports Eo and Uo. A reset signal 759 for the input port R is also connected to the input ports R of the phase comparison termination circuit 200 and the incremental/decremental register 743. The input port CK is input into the phase comparison termination circuit 200. And the input port Up, which receives the comparison output signal 771 is input into the port "in" of the incremental/decremental register 743, and the port Din of the phase comparison termination circuit 200. The output clock (clockb) 758 of the phase comparison termination circuit 200 is connected to the clock input port of the incremental/decremental register 743. A 1-bit logic circuit 753 is constituted by AND circuits 756, 754, and an inverter 742. Numeral 752 denotes 1-bit incremental/decremental register circuits, which are made of a 1-bit logic circuit 753 and a flip-flop 757 with reset. Numeral 743 denotes the 2-bit incremental/decremental register circuit, including two 1-bit incremental/decremental register circuits 752 connected in series. The output bus Uo 751 is made of the inverted lower bit and the upper bit.

Figure 29:
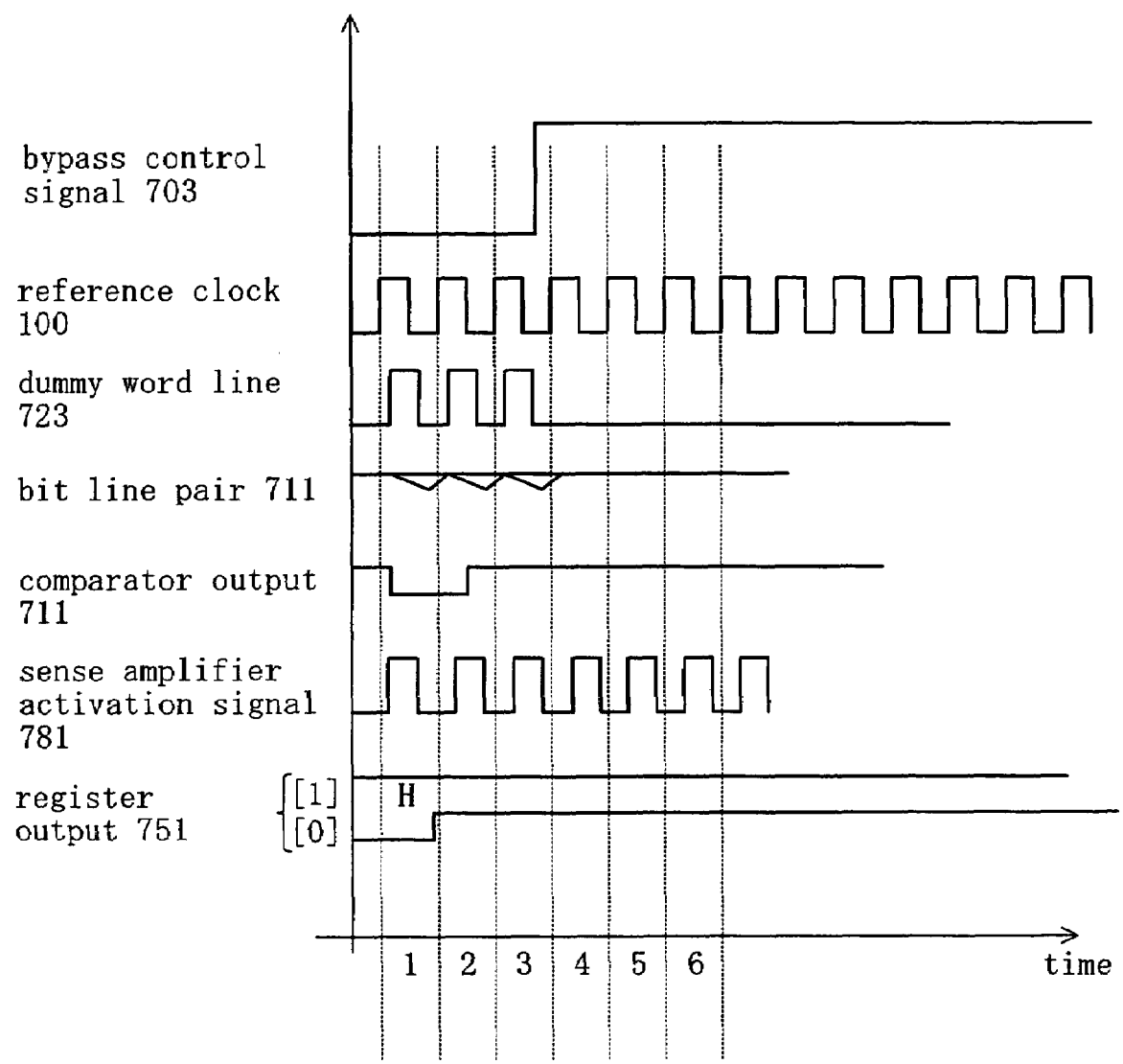
FIG. 29 is a timing chart illustrating the operation of the semiconductor integrated circuit in FIG. 20.

FIG. 29 is a timing chart explaining FIG. 20. In FIG. 29, the horizontal axis denotes time, and the vertical axis denotes the voltage values of various signals, namely the bypass control signal 703, the reference clock 100, the dummy word line 723, the bit line pair 711, the comparator output 771, the sense amplifier activation signal 781, and the output bus 751 of the incremental/decremental register 750. When the signal starting the operation of the PLL circuit 50, that is the PLLON signal 56 becomes "H," the reset of the flip-flop 757 within the incremental/decremental register 750 is released. At first, the bypass control signal 703 is "L," so that the reference clock 100 is connected directly to the SRAM circuit 700. Then, the dummy word line 723 rises, and the internal bit information "0" of the dummy memory cells 731 is transmitted to the bit line pairs 712 of the dummy memory cells 731, a difference occurs in the voltage of the bit line pairs 711, and the sense amplifier activation signal 781 is activated. The comparator 770 performs a comparison thereof, and in this example, since the comparison result of the first period is that they are different, there is an increment, and the output bus 751 of the incremental/decremental register 750 outputs "01." Thus, the delay of the driver of the sense amplification signal 781 is increased, and regular operation becomes possible at the second period.

Regular operation is also performed at the third period, and the bypass control signal 703 from the phase comparison termination circuit 200 becomes "H." Furthermore, the internal content of the incremental/decremental register 750 is held, and the clock from the clock supply circuit 60 is supplied to the SRAM circuit 700.

As described above, racing errors of the sense amplification signal 781 and the word line can be eliminated before the PLL circuit 50 reaches stable operation, and it becomes possible to attain a highly precise SRAM circuit 700 and semiconductor integrated circuit.

EMBODIMENT 6

Figure 30:
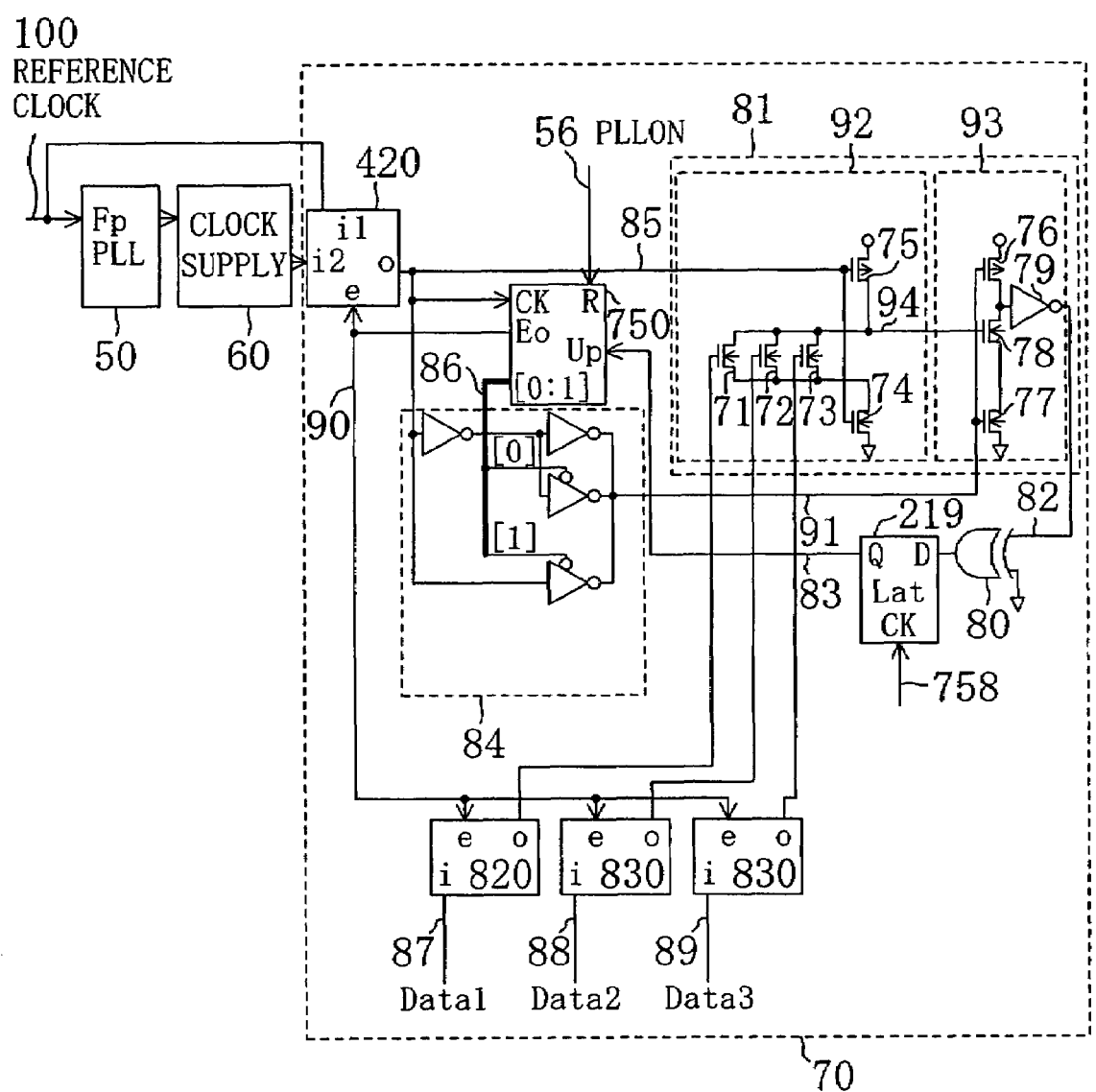
FIG. 30 is a block diagram of a semiconductor integrated circuit in accordance with a sixth embodiment of the present invention.

FIG. 30 is an example of a semiconductor integrated circuit according to another embodiment of the present invention. A data holding circuit 70 in FIG. 30 includes a circuit 81 in which two stages of dynamic circuits 92 and 93 are connected in series, and a switch circuit 420 that switches between the reference clock 100 and the output of a clock supply circuit 60, depending on a bypass control circuit 90. The first dynamic circuit 92 is made of N-type MOS transistors 71, 72, 73 and 74, and a P-type MOS transistors 75, and receives a clock 85 from the switch circuit 420. When the bypass control signal 90 is inactivated, the N-type MOS transistor 74 in the first dynamic circuit 92 is turned on and off in synchronization with the clock 85, and the N-type MOS transistors 71, 72 and 73 are constantly off. When the bypass control circuit 90 is activated, the gates of the N-type MOS transistors 71, 72 and 73 are connected to ordinary data lines 87, 88 and 89. The second-stage dynamic circuit 93, which is connected to an output node 94 of the first dynamic circuit 92, is made of N-type MOS transistors 77 and 78, a P-type MOS transistor 76, and an inverter 79, and receives a clock 91 from a delay adjustment circuit 84. A comparator 80 compares the output 82 of the second-stage dynamic circuit 93 with an expectation value, and a comparator output 83 that is held by a latch 219 operating in synchronization with the clock 758 is supplied to the control register (incremental/decremental register) 750. Then, the strength of the driver in the delay adjustment circuit 84 for the clock 91 that is given into the second-stage dynamic circuit 93 can be increased with the output bus 86 of that control register 750.

Figure 31:
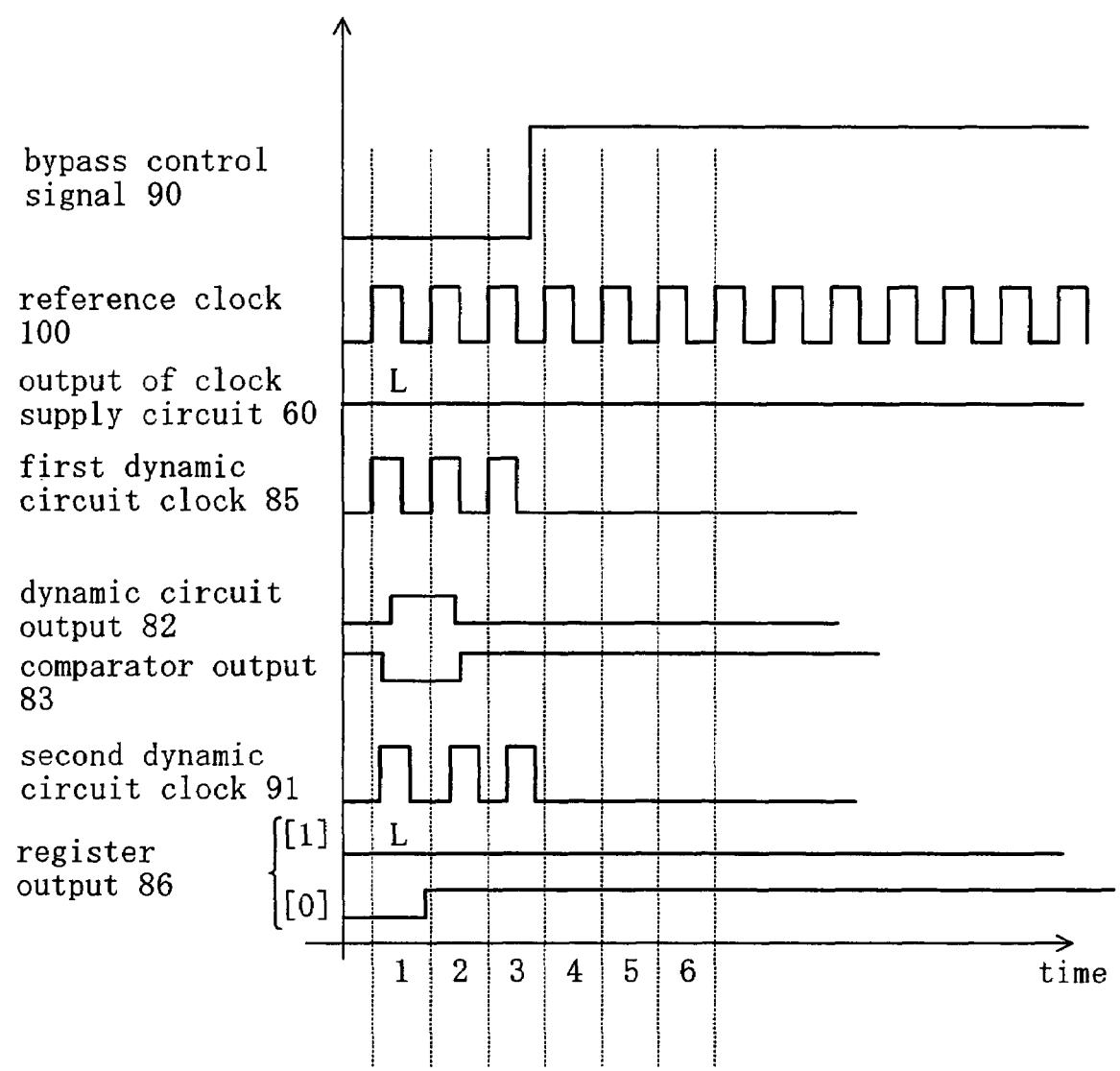
FIG. 31 is a timing chart illustrating the operation of the semiconductor integrated circuit in FIG. 30.

FIG. 31 is a timing chart explaining FIG. 30. In FIG. 31, the horizontal axis denotes time, and the vertical axis denotes the voltage values of various signals, namely the bypass control signal 90, the reference clock 100, the clock signal 85 of the first-stage dynamic circuit, the clock signal 91 of the second-stage dynamic circuit, the dynamic circuit output signal 82, the output signal 83 of the comparator, and the output signal 86 of the incremental/decremental register 750. When the PLLON signal 56 becomes "H," the reset of the incremental/decremental register 750 is released. Then, since the bypass control signal 90 is "L," the clock 85 of the first-stage dynamic circuit is connected directly to the reference clock 100. Moreover, since the bypass control signal 90 is "L," the N-type MOS transistor 74 is turned on and off, and the N-type MOS transistors 71, 72 and 73 are off At the clock of the first period, the dynamic circuit output 82 becomes "H." Up to now, it should be "L." The comparator circuit 80 outputs "H," and the register output 86 is changed from "01" to "10. " Thus, the delay of the clock 91 of the second dynamic circuit is increased. In the second period, the dynamic circuit output 82 becomes "L," and ordinary operation becomes possible. Then in the third period, there is another miss, and in the fourth period, there is a hit. Then, the incremental/decremental register 750 sets the bypass control signal 90 to "H" and holds the register internal information, and the dynamic circuit 81 is directly connected to the output of the clock supply circuit 60.

As described above, the delay of the clock 91 is adjusted such that the second-stage dynamic circuit 93 is activated after the potential of the output node 94 of the first-stage dynamic circuit 92 has settled. Thus, racing errors in the two-phase clock of the serially connected dynamic circuit 81 can be eliminated until the PLL circuit has stabilized, and it is possible to realize a highly accurate semiconductor integrated circuit.

In the above-described Embodiments 4 to 6, if another type of clock generation circuit is used instead of the PLL circuit 50, the adjustment of the portion corresponding to those in the above embodiments is carried out using the reference signal 100 before that clock generation circuit supplies a system clock signal.

EMBODIMENT 7

Figure 32:
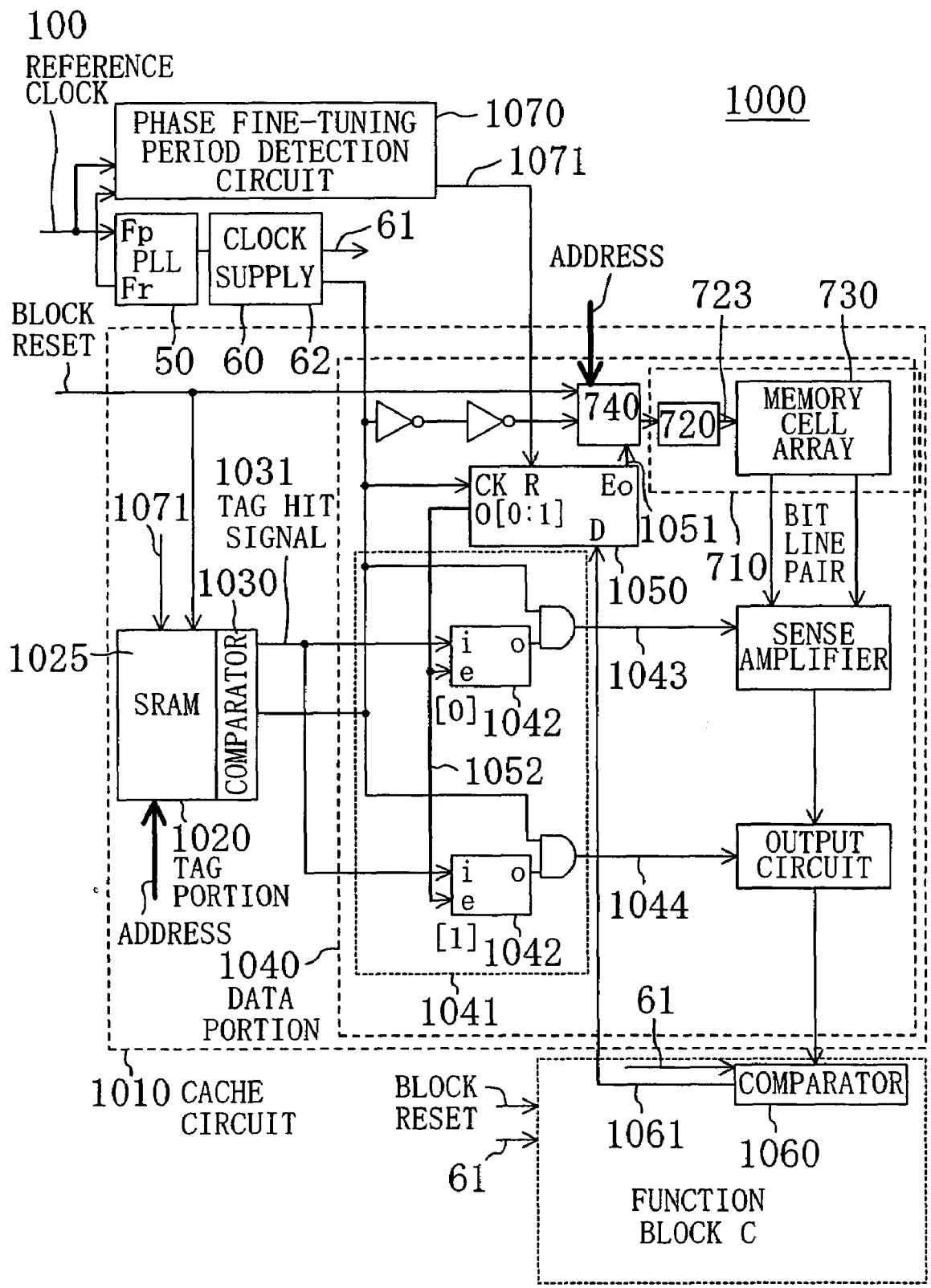
FIG. 32 is a block diagram of a semiconductor integrated circuit in accordance with a seventh embodiment of the present invention.

FIG. 32 is another example of a semiconductor integrated circuit in accordance with the present invention. Numeral 1000 denotes a semiconductor integrated circuit. Numeral 1010 denotes a cache circuit that is synchronized with a clock when a block reset signal is released, and that includes a tag portion 1020 and a data portion 1040. The tag portion 1020 is made of an SRAM circuit 1025 and a comparator circuit 1030. The tag portion 1020 reads an upper address from the SRAM circuit 1025 storing the upper address within the tag at a lower address, and compares the upper address coming from an external block with the comparator circuit 1030. A data portion 1040 accesses an internal memory at the lower address, receives a hit signal 1031 from the tag portion 1020, and has the function to output or write data when the hit signal 1031 indicates a hit. Furthermore, the data portion 1040 includes a sense amplifier and an output circuit, and has a circuit 1041 that controls with a register signal 1052 whether an activation signal 1043 for the sense amplifier and an output activation signal 1044 should operate in response to the hit signal 1031, or whether they should operate in synchronization with the regular clock. Moreover, the semiconductor integrated circuit 1000 also includes a function block C that is synchronized with a clock 61 when the block reset signal is released, and which includes a comparator circuit 1060 that takes in the output data from the data portion 1040 of the internal cache at the clock 61, and compares it with an expectation value. The comparator circuit 1060 is also provided with the function to hold the internal content of the first clock period. The control register 1050 is synchronized with the clock 62, the reset of its internal registers is released with a phase fine-tuning period transmission signal 1071, and its internal registers are incremental counters. When the output signal 1061 of the comparator circuit 1060 is "L," then it operates in synchronization with the clock, and when it is "H." its operation stops. Moreover, it outputs a stop signal (Eo) 1051.

Figure 33:
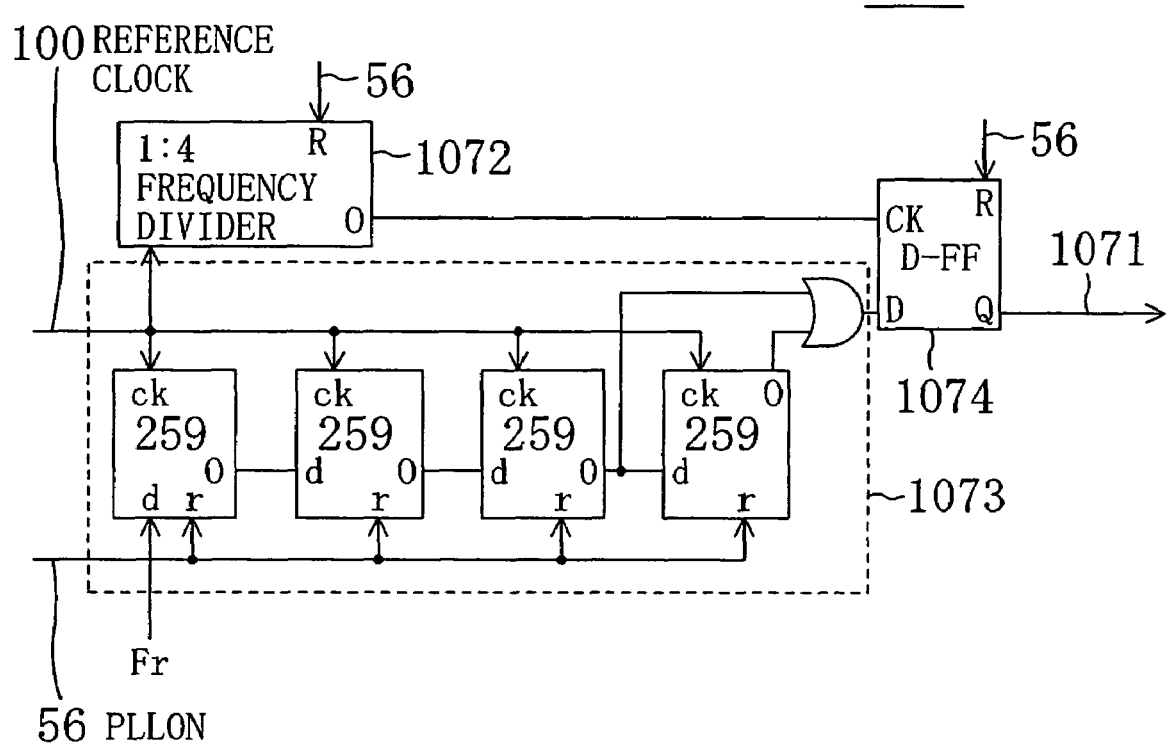
FIG. 33 is a circuit diagram showing the configuration of the phase fine-tuning period detection circuit in FIG. 32.

The semiconductor integrated circuit 1000 further has a phase fine-tuning period transmission circuit 1070, which has the function to transmit the fact that the phase fine-tuning period has been entered at the time when the phase fine-tuning period has been entered after the capturing period of the PLL 50. FIG. 33 is an example of the phase fine-tuning period transmission circuit 1070, which is made of a 1:4 frequency divider 1072 in synchronization with the reference clock, a four-bit incremental register and OR circuit 1073, and a flip-flop 1074. When any of the upper two bits of the incremental register circuit 1073 is "H." then an "H" is given out as 1071, thereby transmitting the fact that a phase fine-tuning adjustment period has been entered. It should be noted that the incremental registers 259 of the various bits constituting the incremental register circuit 1073 have the same internal configuration as shown in FIG. 3.

The phase fine-tuning period transmission signal 1071 releases the reset of the control register 1050 inside the data portion 1040. Furthermore, only when the block reset signal is "L" and the phase fine-tuning period transmission signal 1071 is "H," the cache circuit 1010 accesses the dummy memory cells, and the comparator circuit 1030 hits at every cycle, and access and read-out of the dummy memory cells are performed at each cycle in the data portion 1040. The dummy memory cells are circuits having the same function as those in FIG. 24 described above.

Figure 34:
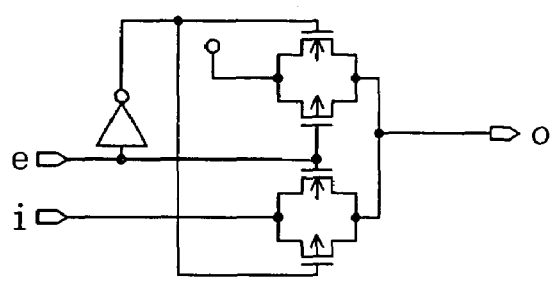
FIG. 34 is a circuit diagram showing the configuration of the switch circuits in FIG. 32.

FIG. 34 shows a configuration example of the switch circuit 1042 in FIG. 32.

Figure 35:
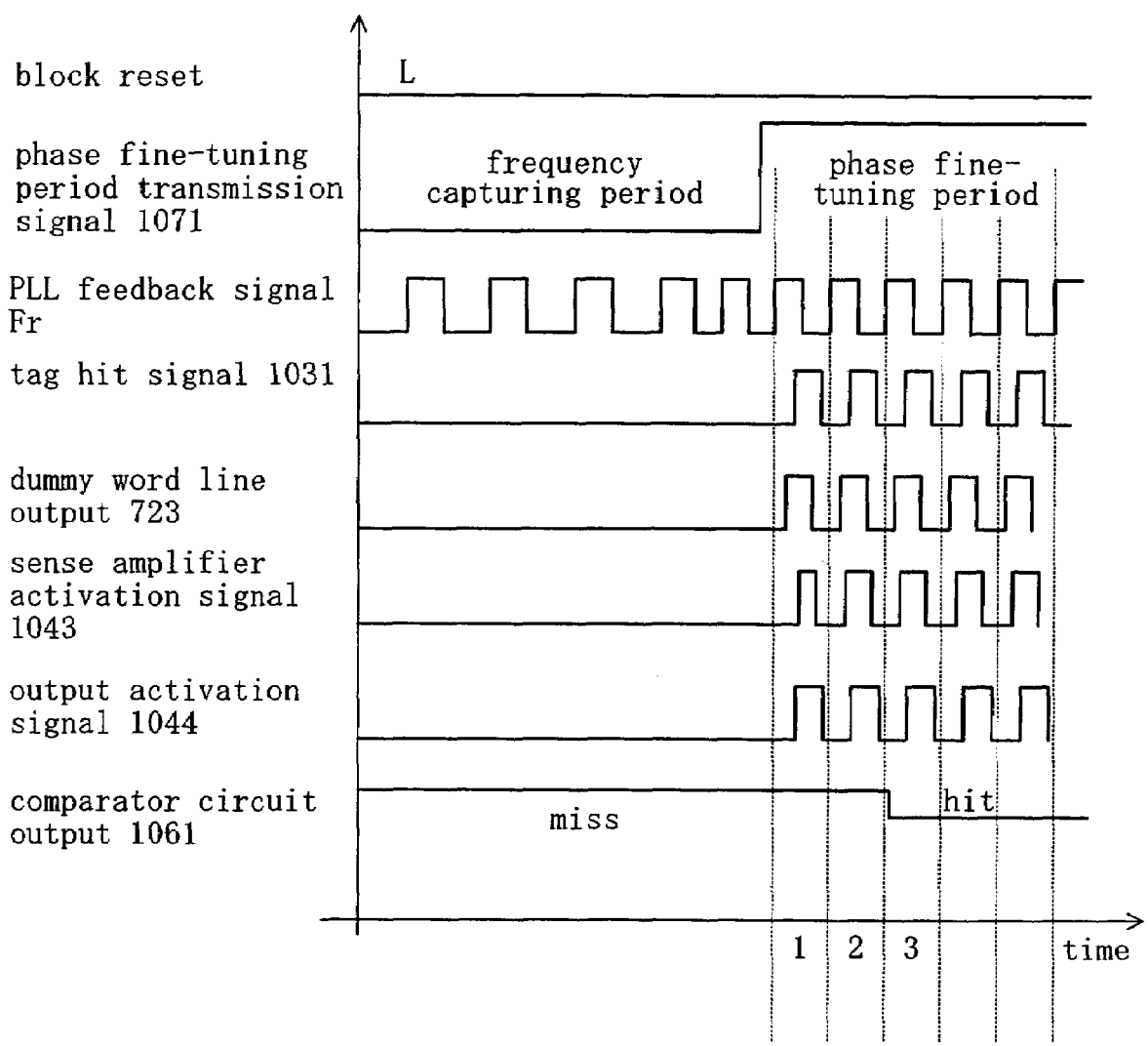
FIG. 35 is a timing chart illustrating the operation of the semiconductor integrated circuit in FIG. 32.

FIG. 35 is a timing chart explaining FIG. 32. In FIG. 35, the horizontal axis denotes time, and the vertical axis denotes the voltage values of various signal lines, namely the block reset signal, the phase fine-tuning period transmission signal 1071, the PLL feedback signal Fr, the tag hit signal 1031, the cache data portion dummy word line 723, the sense amplifier activation signal 1043, the output activation signal 1044, and the comparator circuit output signal 1061. When the PLL circuit 50 is started up, the block reset signal is "L" until it reaches stable oscillation, and any data access to the function blocks is invalid. When the PLL circuit 50 enters the phase fine-tuning period, the phase fine-tuning period transmission signal 1071 becomes "H," and is supplied to the cache circuit 1010.

The comparator circuit 1060 is always synchronized with the clock 61 and outputs a clock that is delayed by the memory access time of the tag portion 1020.

The dummy word line 723 of the data portion 1040 operates ordinarily only during the phase fine-tuning period. As for the register output 1052 of the first period, the sense amplifier activation signal 1043 acts depending on the tag bit signal 1031, and the output activation signal 1044 acts only in synchronization with the clock 62. In this example the comparator circuit 1060 misses, and detects that it is impossible to output normal data with the sense amplifier activation signal 1043 generated by the tag hit signal 1031. Then in the second period, the output of the control register 1050 is changed from "01" to "10."

The sense amplifier activation signal 1043 is synchronized with the clock 61, and operates after the output activation signal 1044 has received the tag hit signal 1031. However, in the third period, the comparator circuit 1060 hits, and this time detects that it is possible to output normal data with the output activation signal 1044 generated by the tag hit signal 1031. Then, the control register 1050 holds its content.

As described above, when the tag portion indicates a cache miss during ordinary operation, whether the operation of either the sense amplifying circuit or the output circuit within the data portion 1040 should be stopped is determined in accordance with the oscillation frequency of the PLL circuit 50 at a time when that frequency has settled. More specifically, if the clock frequency is low, then the operation of the sense amplifier is stopped, and if it is high, then operation of the sense amplifier is allowed but the operation of the output circuit is stopped. Thus, in accordance with clock frequency, device conditions, and temperature dependency, it is possible to stop the optimal logic portion when stopping invalid data during one cycle of the clock, in order to reduce the power consumption. This means, a semiconductor integrated circuit whose power consumption can be reduced efficiently can be achieved.

It should be noted that in the above-described embodiments, the reference clock signal 100 may be supplied from an internal oscillation circuit within the semiconductor integrated circuit, or it may be supplied from outside the semiconductor integrated circuit.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor integrated circuit comprising;
   a clock generation circuit configured for generating a system clock signal from a reference clock signal;
   a switch circuit configured for selectively outputting the reference clock signal or the system clock signal; and
   a clock distribution circuit configured for feeding a clock signal outputted from the switch circuit to a plurality of circuits located outside of the clock generation circuit;
   wherein the switch circuit outputs the reference clock signal until the clock generation circuit starts stabling operation,
   wherein at least one of the plurality of circuits can be configured as a data holding circuit operating in synchronization with the system clock signal; and
   the data holding circuit is capable of performing a racing adjustment in the internal operation of itself with the reference clock signal.

2. The semiconductor integrated circuit according to claim 1, wherein
   the data holding circuit is a memory circuit including a word line and a sense amplifier; and
   the memory circuit is capable of adjusting the activation timing of the sense amplifier with respect to activating the word line so that a read-out error does not occur.

3. The semiconductor integrated circuit according to claim 1, wherein
   the data holding circuit comprises a first and a second dynamic circuit connected to each other in series, and a delay circuit configured for delaying an input clock signal of the first dynamic circuit and supplying the input clock signal to the second dynamic circuit; and
   the data holding circuit passes the reference clock signal to the first dynamic circuit and the delay circuit, and adjusts the delay of the delay circuit so that an activation timing of the second dynamic circuit with respect to an output change of the first dynamic current is optimized.

4. A semiconductor integrated circuit comprising;
   a clock generation circuit configured for generating a system clock signal from a reference clock signal;
   a switch circuit configured for selectively outputting the reference clock signal or the system clock signal; and
   a clock distribution circuit configured for feeding a clock signal outputted from the switch circuit to a plurality of circuits located outside of the clock generation circuit;
   wherein the switch circuit outputs the reference clock signal until the clock generation circuit starts stabling operation,
   wherein the clock distribution circuit comprises a plurality of drivers configured for feeding the clock signal outputted from the switch circuit to the plurality of circuits; and
   the clock distribution circuit is capable of adjusting strength of the plurality of drivers based on the reference clock signal while the switch circuit outputs the reference clock signal.

* * * * *

UNITED STATES PATENT AND TRADEMARK OFFICE
CERTIFICATE OF CORRECTION

PATENT NO. : 7,274,261 B2 Page 1 of 1
APPLICATION NO. : 11/106471
DATED : September 25, 2007
INVENTOR(S) : Masaya Sumita It is certified that error appears in the above-identified patent and that said Letters Patent is hereby corrected as shown below:

On the title page of the Letter Patent,

Under section (54), change "SEMICONDUCTOR INTEGRATED CIRCUIT" to -- SEMICONDUCTOR INTEGRATED CIRCUIT WITH CLOCK GENERATION CIRCUIT --

Signed and Sealed this

Eighth Day of July, 2008

JON W. DUDAS
*Director of the United States Patent and Trademark Office*

UNITED STATES PATENT AND TRADEMARK OFFICE
CERTIFICATE OF CORRECTION

PATENT NO. : 7,274,261 B2 Page 1 of 1
APPLICATION NO. : 11/106471
DATED : September 25, 2007
INVENTOR(S) : Masaya Sumita It is certified that error appears in the above-identified patent and that said Letters Patent is hereby corrected as shown below:

On the title page of the Letters Patent,

Under section (54) and Column 1, line 1, change "SEMICONDUCTOR INTEGRATED CIRCUIT" to --SEMICONDUCTOR INTEGRATED CIRCUIT WITH CLOCK GENERATION CIRCUIT--

This certificate supersedes the Certificate of Correction issued July 8, 2008.

Signed and Sealed this

Twenty-ninth Day of July, 2008

JON W. DUDAS
*Director of the United States Patent and Trademark Office*